United States Patent
Alasseur et al.

(10) Patent No.: US 11,023,645 B1
(45) Date of Patent: Jun. 1, 2021

(54) METHOD, SYSTEM, AND PRODUCT TO EFFICIENTLY ROUTE INTERCONNECTIONS FOLLOWING A FREE FORM CONTOUR

(71) Applicant: Cadence Design Systems, Inc., San Jose, CA (US)

(72) Inventors: Xavier Alasseur, Ajaccio (FR); Arnold Jean Marie Gustave Ginetti, Antibes (FR)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 16/587,052

(22) Filed: Sep. 30, 2019

(51) Int. Cl.
*G06F 30/394* (2020.01)

(52) U.S. Cl.
CPC .................. *G06F 30/394* (2020.01)

(58) Field of Classification Search
CPC .................................................. G06F 30/394
See application file for complete search history.

(56) References Cited

U.S. PATENT DOCUMENTS

2002/0056912 A1*  5/2002  Roth .................... H01L 23/5225
                                                              257/750
2005/0240893 A1* 10/2005  Teig ....................... G06F 30/394
                                                              257/773
2019/0157253 A1*  5/2019  Browning ............... H01L 25/18

OTHER PUBLICATIONS

Koh, Cheng-Kok, and Patrick H. Madden. "Manhattan or Non-Manhattan? A study of alternative VLSI routing architectures." Proceedings of the 10th Great Lakes symposium on VLSI. 2000.

* cited by examiner

*Primary Examiner* — Vuthe Siek
(74) *Attorney, Agent, or Firm* — Vista IP Law Group, LLP

(57) ABSTRACT

An approach is described for a method, system, and product for detection of contours for data pads of a device having a free form contour, clustering integrated circuit pads and data pads, performing any angle routing based on a contour angle, and performing resistance balancing. For example, data pads of a display device having one or more curved contours (e.g. data pads arranged on an arc) are identified. Corresponding data pads and integrated circuit pads are then grouped together for routing interconnections and subsequently routed using any angle routing instead of merely routing interconnections with turns having 90-degree or 45-degree angles. Finally, the routed interconnects may be further refined/modified to balance resistances of the interconnections.

20 Claims, 25 Drawing Sheets

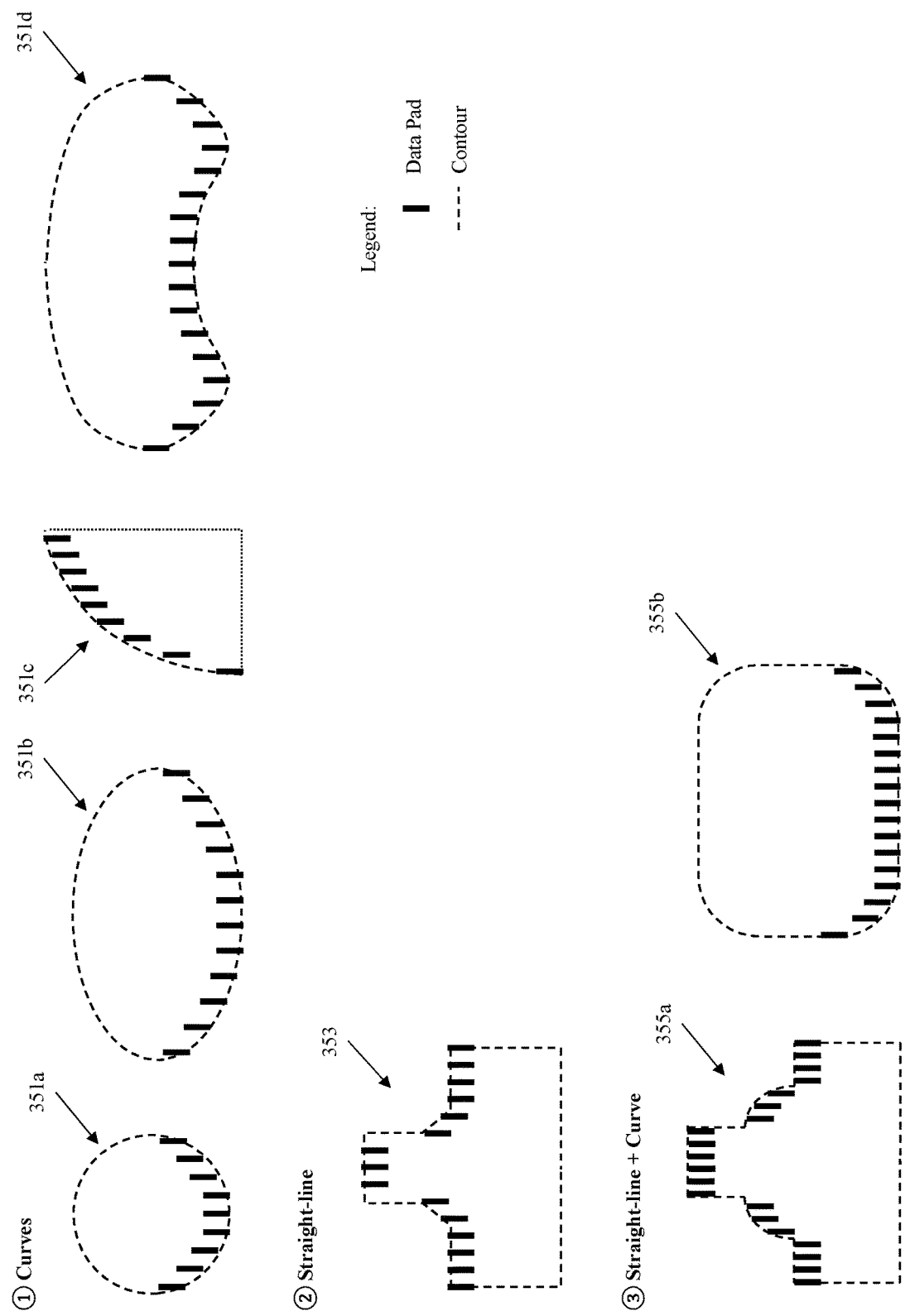

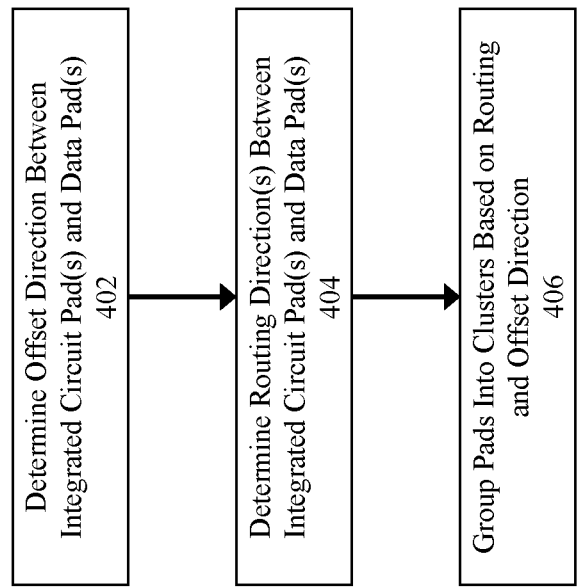

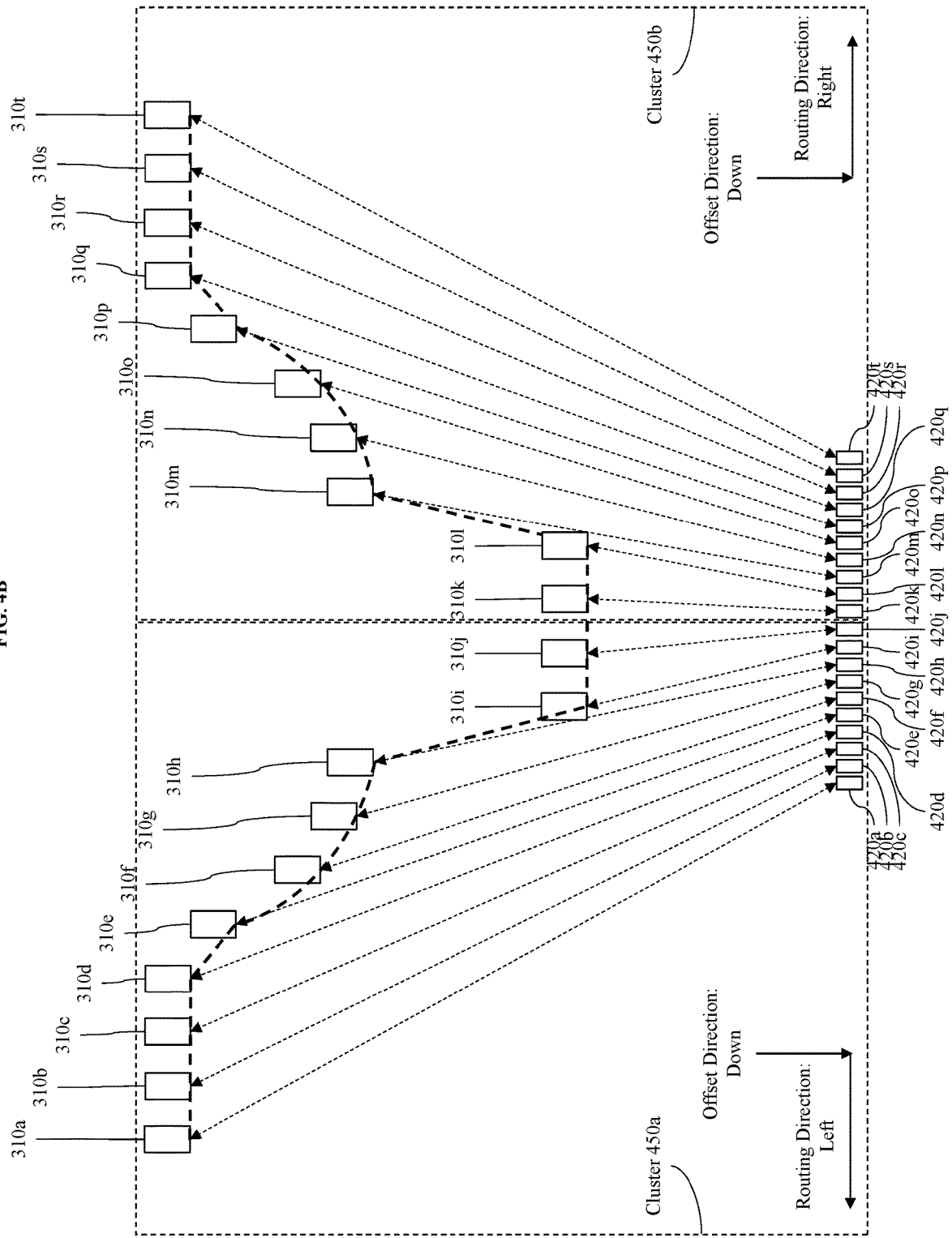

METHOD, SYSTEM, AND PRODUCT TO EFFICIENTLY ROUTE INTERCONNECTIONS FOLLOWING A FREE FORM CONTOUR

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Once packaged, semiconductors can be put to use in different environments. As technology changes it continues to be adapted to the environment, and to suit functional and ascetic desires. In the realm of display technology, the rectangular displays of the past have given way to curved and compound shapes (free form) in the present, particularly in the realm of automobiles.

However, routing tools for connecting the semiconductors to the free form devices (e.g. displays) have not advanced to address new challenges of free form devices—such as those created by displays that are curved or have curved elements which are not completely rectangular.

As a result, the interconnection of semiconductors to free form devices results in inefficient routing that consumes substantially more space then truly necessary. This causes increased use of resources (i.g. substrate material and metal layers), manufacturing costs, and space necessary to deploy and/or use such devices.

Therefore, what is needed is improve approach to efficiently route interconnections following a free form contour.

SUMMARY

Embodiments of the present invention provide a method, system, and product to efficiently route interconnections following a free form contour.

According to some embodiments, the approach includes detection of contours for data pads of a device having a free form contour, clustering integrated circuit pads and data pads, performing any angle routing based on a contour angle, and performing resistance balancing. For example, data pads of a display device having one or more curved contours (e.g. data pads arranged on an arc) are identified. Corresponding data pads and integrated circuit pads are then grouped together for routing interconnections and subsequently routed using any angle routing instead of merely routing interconnections with turns having 90-degree or 45-degree angles. Finally, the routed interconnects may be further refined/modified to balance resistances of the interconnections.

Other additional objects, features, and advantages of the invention are described in the detailed description, figures, and claims.

BRIEF DESCRIPTION OF FIGURES

In order that the present invention is better understood, some embodiments of the invention will now be described, by way of example only, with reference to the accompanying drawings.

FIG. 3C illustrates example contours for different sets of data pads according to some embodiments.

FIG. 4A illustrates a flow of an approach to cluster integrated circuit pads and data pads as described for step 204 in FIG. 2 according to some embodiments.

FIG. 4B illustrates two example clusters associated with a contour according to some embodiments.

DETAILED DESCRIPTION

Figure 1:
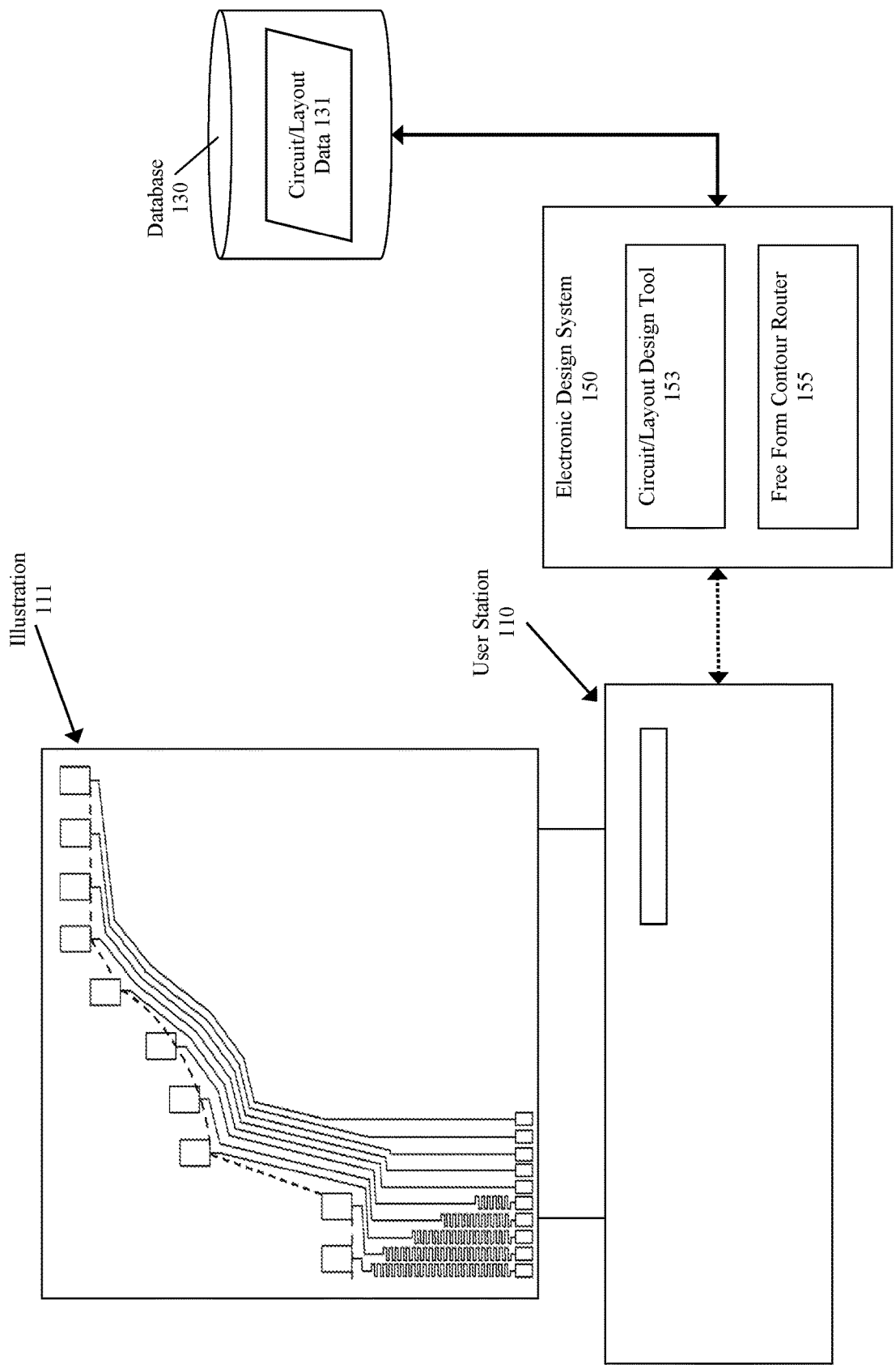
FIG. 1 illustrates an example system to efficiently route interconnections following a free form contour according to some embodiments.

Embodiments of the present invention provide a method, system, and product to efficiently route interconnections following a free form contour.

According to some embodiments, the approach includes some or all of detecting contour(s) for data pads, clustering data pads and integrated circuit (IC) pads, performing any angle routing based on a contour, and performing resistance balancing. In some embodiments, contours comprise circles, ovals, straight lines, or any combinations of all or a portion thereof.

In some embodiments, detecting contour(s) for data pads includes identifying pad locations from an electronic design file, generating multiple possible contour segments for a contour using a fitting process against each data pad, selecting at least a subset of the possible contour segments based on one or more rules (i.g. minimum number of contour segments and connection lines needed), and generating any connection lines needed to close the contour. Further aspects of the approach provided in the subsequent paragraphs according to some embodiments.

Data pads and integrated circuit pads are clustered together based on a routing and/or offset direction. For instance, integrated circuit pads that are to be routed to data pads that are to the left of the integrated circuit pads are clustered together into a group for routing. Subsequently, those paths that connect the pads are individually routed in relation to an adjacent path.

Routing is performed on a cluster by cluster basis. For instance, a first cluster is selected, then a first data pad integrated circuit pair is selected. The selected pair is then routed by connecting an edge that is aligned to an axis perpendicular to the routing direction to a data pad connection point at an angle determined based on at least the angle of the contour and a reference line at an intersection point for the data pad. In some embodiments, adjacent paths for another data pad and integrated circuit pair are routed following a previously routed adjacent path with an additional interconnection segment to extent the path to the final connection point.

Routing is generated using guide lines and junction lines. The guide lines are used for, at least, enforcing spacing requirements and the junction lines are used for identifying intersection points of different interconnection segments along the same path. Additionally, guide lines are used for enforcing spacing requirements between parallel interconnection segments and the junction lines bisect angles between two interconnection segments that interest at the junction line.

The routed paths are analyzed for resistance balancing. Resistance balancing can be important because it helps ensure that signals arrive at a similar time despite having potentially large differences in the length those signals would otherwise need to propagate. For example, the resistances of the paths are analyzed to determine the average resistance, zigzags are inserted to increase resistances of paths where appropriate, and traces are widened to decrease the resistances of paths in order to balance the resistances of the paths to within a threshold of each other or an average resistance.

FIG. 1 illustrates an example system to efficiently route interconnections following a free form contour according to some embodiments. Generally, an electronic design system including a free form contour router utilizes circuit/layout data and a free form routing process to route interconnections (paths) to data pads that correspond to a free form arrangement of the data pads.

The user station 110 includes or provides access to an electronic design system 150. For instance, the electronic design system 150 might be located on the user station 110, on a remote device accessed by the user station, or distributed across multiple devices. In some embodiments, the electronic design system 150 is deployed within a cloud computing environment (e.g. public or private cloud) and is accessed via a user station 110, where the cloud computing environment may provide for increased computing performance by leveraging multiple computing devices in contrast to a single user's computing device. The user station 110 causes the execution of instructions for efficiently routing following a free form contour according to some embodiments as disclosed herein. The user station 110 comprises any type of computing station that is useable to operate or interface with the database 130. Examples of such user stations include workstations, personal computers, or remote computing terminals. In some embodiments, the user station 110 comprises a display device, such as a display monitor, for displaying a user interface to users at the user station. The user station 110 also comprises one or more input devices for the user to provide operational control over the user station, such as a mouse or keyboard to manipulate a pointing object in a graphical user interface. In some embodiments, the graphical user interface includes tools for controlling and/or configuring the electronic design system such as configuring one or more rules/parameters for routing interconnections that follow a free form contour.

As provided in FIG. 1, user station 110 displays illustration 111 which shows integrated circuit pads (lower left of illustration) connected to data pads (upper portion of illustration) corresponding to a contour generated using the techniques illustrated herein. The integrated circuit pads being connected to the data pads via interconnections (paths).

The electronic design system 150, as illustrated, includes a circuit/layout design tool 153 and a free form contour router 155. In some embodiments, the various components, or the functions, of the electronic design system 150 are combined or separated into different components from those illustrated.

The circuit/layout design tool 153 comprises a tool for creating and or modifying a layout of a circuit design. For instance, circuit/layout design tools are generally known in the art and comprise different components for different types of design activities. One circuit design component might comprise an interface for accepting a hardware description or portion thereof as described by a hardware design language (e.g. Verilog, VHDL, etc.). Another circuit design component might comprise a circuit design component for manually manipulating/creating a circuit design using a circuit schematic. A layout design component might comprise a layout editor for modifying/creating layers of a design as the layers would be constructed on a semiconductor substrate or printed circuit board. Generally, the circuit/layout design tool 153 operates on circuit/layout data (e.g. circuit/layout data 131) and can be used to generate a circuit layout used in semiconductor/electronics manufacturing. In some embodiments, the circuit/layout design tool 153 is modified to include an interface to control/access the free from contour router 155. The free form contour router 155 will be described further below. Briefly, the free form contour router 155 automatically generates interconnections by routing from a first element (e.g. integrated circuit pad) to a second element (e.g. display device data pad) where the data pads are arranged in a free form manner as illustrated herein. However, while the present invention is described in the context of integrated circuit pads and data pads for a display device, the present techniques can be used for routing paths between two sets of points where at least one set of points correspond to a contour—e.g. in an interactive any angle bus editing/routing flow.

The system includes a database 130 which is illustrated as including circuit/layout data 131. In some embodiments, the database 130 comprises a single database with one or more subsets within that database for the circuit data and the layout data as illustrated in FIG. 1. However, in some embodiments the database comprises multiple separate databases on different computing systems and/or in different locations connected via electronic communication links (e.g.

wired and/or wireless networks). The system may further include database access modules for accessing and storing the data, whether stored at a single database or at multiple databases.

The circuit/layout data 131 comprises any types of representations of a design. For instance, the design data comprises any one or more of a hardware descriptive language design, a circuit schematic design, a circuit layout, or any combination thereof. The circuit/layout data 131 corresponds to at least layout data. In some embodiments, the circuit/layout data 131 includes multiple different free form routing data sets comprising any angle routing of integrates circuit pads to data pads.

Figure 2:
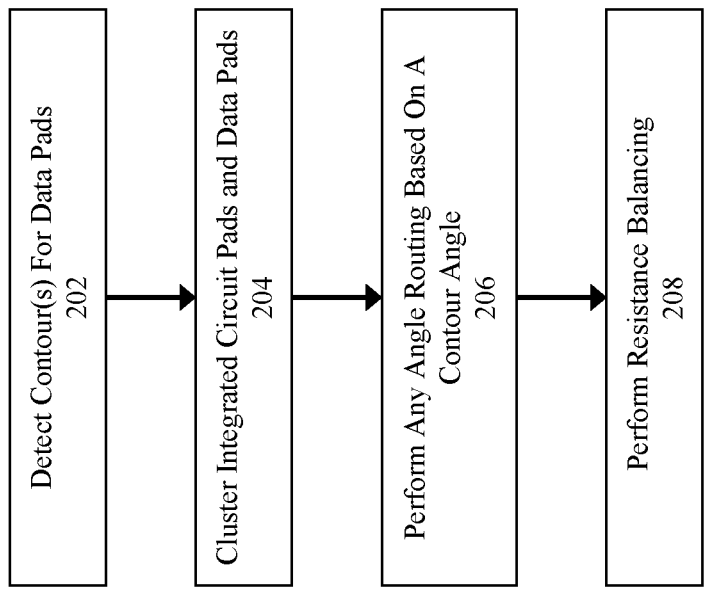
FIG. 2 illustrates a flow to efficiently route interconnections following a free form contour according to some embodiments.

FIG. 2 illustrates a flow to efficiently route interconnections following a free form contour according to some embodiments. Generally, the process includes at least one or more of detection of contours for data pads, clustering of integrated circuit pads and data pads, performing any angle routing based on contour angle(s), and performing resistance balancing.

The process starts at 202 where contours of data pads are detected. Detection of the contours is discussed further in regard to FIG. 3A-3C. Briefly, the process comprises identifying data pad locations, and generating one or more contour segments comprising curved or straight lines that intersect with reference points for the data pads, where each of the contour segments are closed by connecting each contour segment with a straight line. For example, a contour might comprise a circular contour segment, a straight contour segment, and an elliptical contour segment, where contour segments are connected by one or more lines to close the contour.

At 204, integrated circuit pads and data pads are clustered together to form clusters for performing the any angle routing. The clustering will be discussed further below, in regard to FIGS. 4A-4B. Generally, the process comprises clustering corresponding integrated circuit pads and data pads based on an offset direction and a routing direction, both of which may depend on the relative positioning of corresponding data pads and integrated circuit pads.

At 206, any angle routing is performed based on at least contour angles associated with respective data pads within each cluster. This process will be discussed further below, but generally comprises generating interconnection segments along a contour to decrease the area necessary for routing interconnections between integrated circuit pads and data pads when compared to standard 90 degree and 45 degree routing.

At 208, the interconnections are modified and/or rerouted as part of a resistance balancing process. For example, an average resistance for the interconnections is determined, interconnections with less resistance then the average are modified to increase their resistance (e.g. by adding zig zags to increase their length), and interconnections with more resistance then the average are rerouted with greater widths to decrease their resistance. An embodiment of resistance balancing will be discussed further in regard to FIGS. 6A-6B.

Figure 3A:
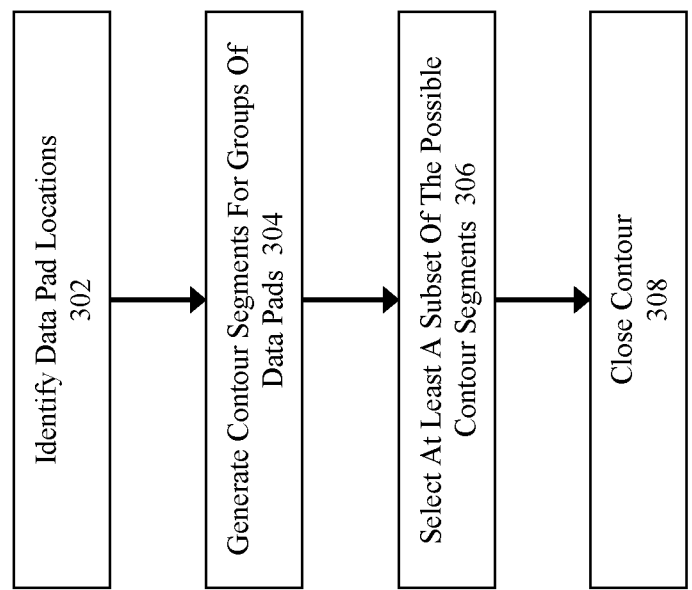
FIG. 3A illustrates a flow of an approach to detect contour(s) for data pads as described for step 202 in FIG. 2 according to some embodiments.

FIG. 3A illustrates a flow of an approach to detect contour(s) for data pads as described for step 202 in FIG. 2 according to some embodiments. Generally, the process identifies data pads for which a contour is to be determined and generates a plurality of possible contour segments from which it constructs a final contour.

For instance, the process starts at 302, where data pad locations are identified. For example, data pad locations are identified based on at least the circuit/layout data 131. In some embodiments, data pad locations are identified from entries in the circuit/layout data 131 that specify a reference position for those data pads. In some embodiments, one or more rules are used to determine or reduce the data pad locations to a single point—e.g. for each data pad: the greatest/smallest x and greatest/smallest y values, the center of the data pad, a center point along one or more axis along with a greatest/smallest value for other axis. In some embodiments, the data pads corresponding to the free form contour to be routed are identified by any combination of an identifier that specifies a free form contour, a selection by a user, a user input, a device type associated with the data pads, by a threshold number of x or y position values, or by a device layout.

At 304, contour segments are generated for groups of data pads. One possible approach to generate contour segments is to identify, for each data pad, groups of three or more data pads that are adjacent to each other for generation of a contour. Normally, for any three data pads, either a straight line or an arc (e.g. circle/ellipse or portion thereof) can be drawn between them which intersects the data pad location. Thus, for any three data pads, either an arc or a straight-line contour segment is generated as a possible contour. Subsequently, another data pad is added to the group and processed to determine whether the arc or the straight line, previously generated, can be extended such that it intersects all the data pad locations in the group. If such an arc or straight line was generated, then the arc or straight-line contour segment is output as a possible contour segment. The process will continue to add data pads to the group and generate possible contour segments until it is no longer possible to intersect all the data pad locations in the group with a straight line or an arc. Then, another group of data pads will be identified and processed in the same way until all possible groups have been analyzed (e.g. by selected each data pad in turn as a starting point for the group).

At 306, a set of contour segments are selected from the generated possible contour segments. For example, the set of contour segments might be selected based on the lowest number of lines that would need to be generated to close the contour for the identified data pads, based on the highest average number of data pads in each group, based on the highest/lowest number of contour segments, or any other rule or combination of rules.

Figure 3B:
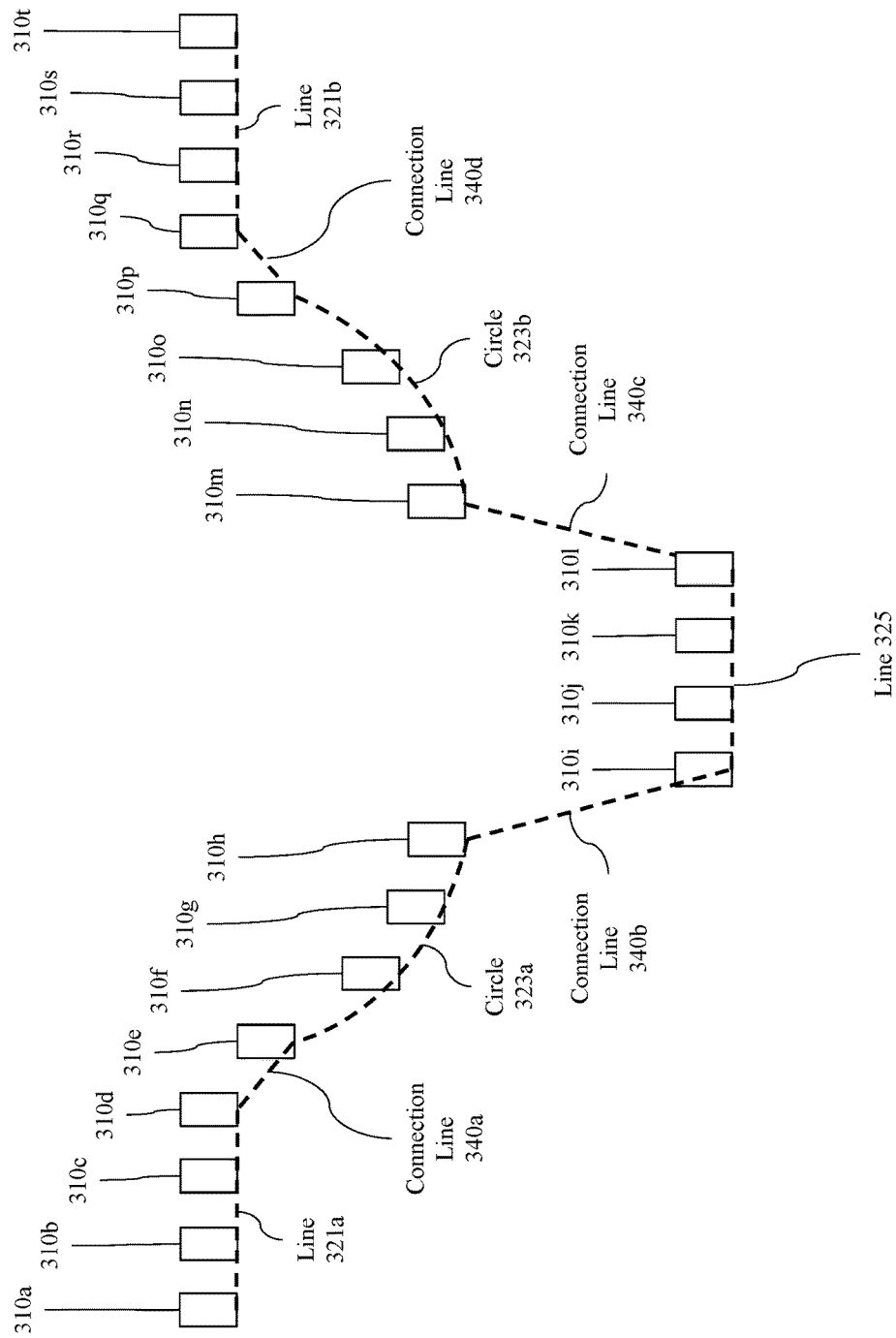
FIG. 3B illustrates an example contour for a set of data pads according to some embodiments.

At 308, the set of contour segments are closed to generate a complete contour. For instance, each contour segment is connected to a corresponding next contour segment via a line that intersects the last data pad location of the previous contour segment and the first data pad location of the subsequent contour segment. Thus, the contour generally comprises one or more contour segments and potentially one or more connection lines. FIG. 3B provides an illustration of contour segments and data pads associated with the generation of a contour.

FIG. 3B illustrates an example contour for a set of data pads according to some embodiments. Here, the illustration includes five contour segments connected via four connection lines and encompassing 20 data pads.

For instance, data pads 310*a-d* correspond to straight line contour segment 321*a*, data pads 310*e-h* correspond to circular contour segment 323*a*, data pads 310*i-l* correspond to straight line contour segment 325, data pads 310*m-p* correspond to circular contour segment 323*b*, and data pads 310*q-t* correspond to straight line contour segment 321*b*. Additionally, each of the contour segments can be connected by a connection line, i.e. the straight line contour segments 340*a-d*.

Additionally, FIG. 3B can be used to illustrate the generation of possible contour segments according to some embodiments. For instance, a first group is selected comprising data pads 310a-c. Then, the process attempts to draw an arc and/or a straight-line through the data pads in the group. Here, a straight line but not an arc can be drawn through data pads 310a-c (for the initial group size of three). Subsequently, 310d is added to the group of 310a-c and the system attempts to extend the straight line through 310a-d which is successful. Finally, 310e is added to the group, but the system cannot extend the straight line through 310e, and therefore does not generate a possible contour segment for this group. Additionally, the system advances to the next data pad to start a new group which is 310b-d here. As before, a straight-line contour segment can be drawn between 310b-d, but when 310e is added to the group no straight-line contour segment can be drawn between the group. The process continues, drawing lines/arcs that connect the data pads in each group until all possible contour segments are generated from which the final contour is generated.

FIG. 3C illustrates example contours for different sets of data pads according to some embodiments. Generally, the contours comprise curves (e.g. circles, ellipses, or combinations thereof), straight line contour segments, or combinations of curves and straight-line contour segments. In some examples, not all data pads are illustrated for ease of understanding.

Examples 351a-d comprise a plurality of shapes comprising one or more curved contour segments. Example 351a comprises a plurality of contacts along a circular contour whereas example 351b has a plurality of contacts along an elliptical contour. Example 351c comprises a plurality of contacts along an elliptical contour. However, whereas 351a-b are both represented by a single full contour segment, a circle and an ellipse respectively, 351c is represented by a single partial contour segment—roughly a quarter of a full ellipse. In contrast, 351d is represented by multiple curved contour segments such as ellipses and circles.

Example 353 comprises a plurality of straight-line contour segments e.g. three horizontal contour segments, and two diagonal contour segments. Finally, examples 355a and 355b combine the straight-line contour segments with the curved line contour segments (e.g. circles and ellipses) to define the contour.

FIG. 4A illustrates a flow of an approach to cluster integrated circuit pads and data pads as described for step 204 in FIG. 2 according to some embodiments. Generally, the process uses a location-based relationship between the integrated circuit pads and data pads, and between data pads and the contour, to determine how to group pads into clusters.

The process starts, at 402, where an offset direction is determined for each data pad. According to some embodiments, the offset direction is used to determine a projection direction from the data pad towards a corresponding integrated circuit pad. The process works by determining a spatial relationship between a data pad, a corresponding integrated circuit pad, and a corresponding contour segment. In some embodiments, the offset direction is determined by generating a vector comprising a component having multiple dimensions (e.g. horizontal and vertical) and selecting the component of the vector that is greater/greatest as the offset direction (e.g. downward along a vertical axis), where the component selected intersects with the contour. In some embodiments, the offset direction is determined based on its intersection and/or perpendicular orientation with/to the corresponding contour segment (the one determined in 202). In some embodiments, the offset direction is aligned with a layout/routing axis.

At 404 a routing direction between each of the integrated circuit pads and data pads is determined. Generally, the routing direction corresponds to the direction from the integrated circuit pad to the data pad which is the direction that the process will use to create/route interconnection segments as part of generating the paths. Specifically, the offset direction is aligned with one axis of the electronic design. The process works by using the spatial relationship between corresponding integrated circuit pads and data pads. In some embodiments, the routing direction comprises a horizontal direction and a vertical direction and is determined based on the position of an integrated circuit pad and the corresponding data pad. For instance, if an integrated circuit pad is below and to the right of a corresponding data pad, then the routing direction to the left and to the offset direction is downward, which results in the routing being performed from right to left and from bottom to top. In some embodiments, the routing direction is represented as a unit vector in the horizontal or the vertical direction. In some embodiments, the routing direction is aligned with a routing axis and is perpendicular to the offset direction. Specifically, if the offset direction is horizontal, then the routing direction is vertical, and is in the direction defined by the spatial relationship between the integrated circuit pad and the data pad.

At 406, integrated circuit pads and data pads are grouped into clusters based on the routing and offset directions. For instance, data pads and corresponding integrated circuit pads are grouped together when they have the same combination of routing and offset directions. For example, data pads and corresponding integrated circuit pads that are associated with a downward vertical offset and a routing direction to the left are grouped into one cluster, while data pads and corresponding integrated circuit pads that are associated with a downward vertical offset and a routing direction to the right are grouped into another cluster.

FIG. 4B illustrates two example clusters associated with a contour according to some embodiments. Generally, the process illustrates clustering of like with like, where like is defined by the offset and routing directions.

FIG. 4B illustrates data pads 310a-t and the contour constructed from the contour segments and connection lines (321a-b, 323a-b, 325, and 340a-d) as in FIG. 3B. Additionally, FIG. 4B illustrates integrated circuit pads 420a-t which are to be routed via interconnection segments to corresponding data pads 310a-t—e.g. integrated circuit pad 420a is to be connected to data pad 310a, integrated circuit pad 420b is to be connected to data pad 320b, etc. Here, the figure illustrates two clusters 450a and 450b. The first cluster, 450a, comprises the integrated circuit pads 420a-j and data pads 320a-j that are associated with the same offset and routing directions (down and to the left respectively). The second cluster, 450b, comprises the integrated circuit pads 420 k-t and data pads 320k-t that are associated with the same offset and routing direction that is different from the first cluster. Specifically, the second cluster, 450b, is associated with an offset direction that is down and a routing direction that is to the right.

Figure 5:
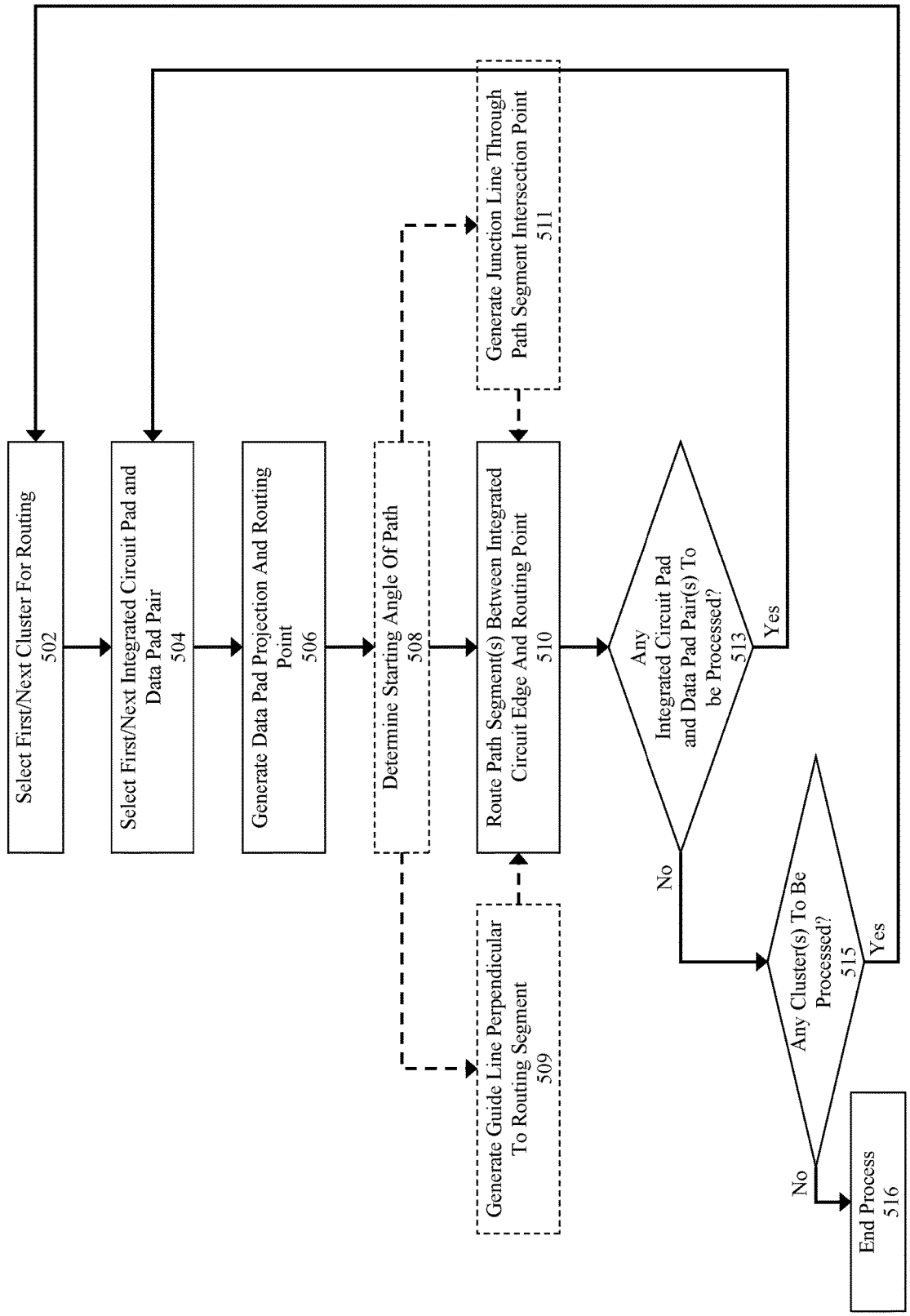
FIG. 5 illustrates a flow of an approach to perform any angle routing based on a contour angle as described for 206 in FIG. 2 according to some embodiments.

FIG. 5 illustrates a flow of an approach to perform any angle routing based on a contour angle as described for 206 in FIG. 2 according to some embodiments. Generally, the process cycles through individual integrated circuit pad and data pad pairs of a selected cluster to perform any angle routing. In some embodiments, this includes selection of different clusters for routing, selection of each integrated circuit pad and data pad pair in the group in turn, where a start angle is first determined, and then subsequent interconnection segments are then routed to follow adjacent interconnection segments while they maintain compliance with spacing rules.

The process starts at 502 where a first/next cluster is selected for routing. For instance, a first cluster might comprise integrated circuit pads and data pads with a downward offset direction and a routing direction to the right. Once, a cluster is selected, then at 504 a first/next integrated circuit pad and data pad pair is selected in a loop until all the integrated circuit pad and data pad pairs are processed.

Figure 6A:
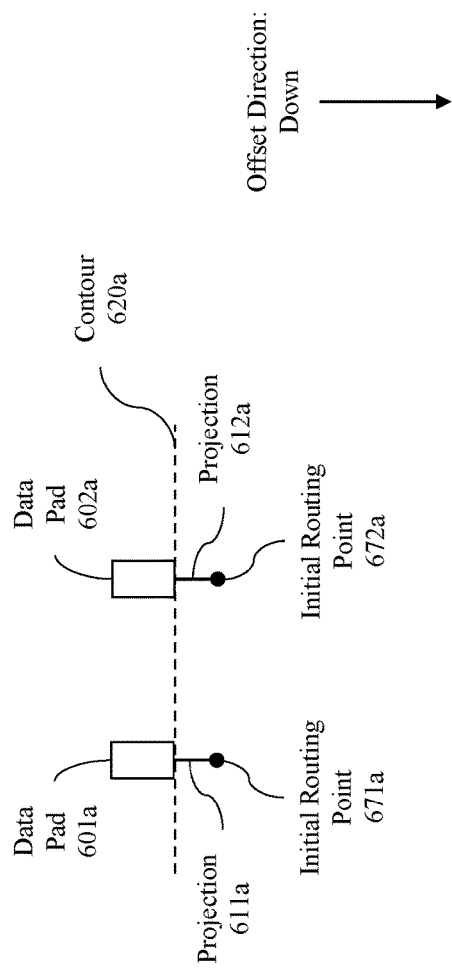
FIGS. 6A-6B illustrate the generation of data pad projections and routing points as described for 506 in FIG. 5 according to some embodiments.
Figure 6B:
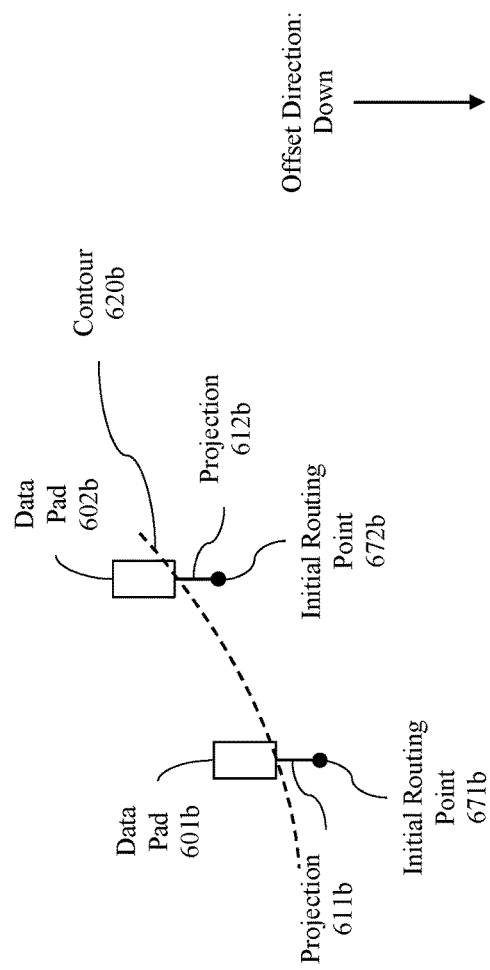

At 506, a data pad projection and routing point are determined. Generally, the data pad projection is in the direction of the offset used to identify the cluster. Thus, if the offset direction is downward, a data pad projection is created in the downward direction. For example, a data pad projection is created from the data pad which extends 10 nm downward past the contour segment. Finally, at the end of the data pad projection a routing point is generated for future connection to an interconnection segment. In some embodiments, all or groups of data pad projections and corresponding routing points are generated prior to performing any other routing. Generation of data pad projections and routing points is illustrated in FIGS. 6A-B.

Figure 7A:
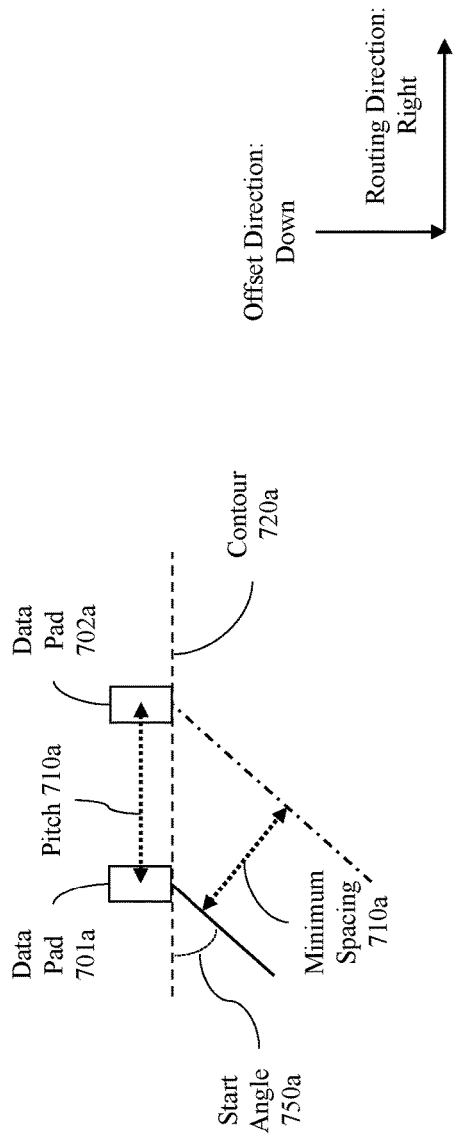
FIGS. 7A-7B illustrate the determination of a starting angle of an interconnection segment as described for 508 in FIG. 5 according to some embodiments.
Figure 7B:
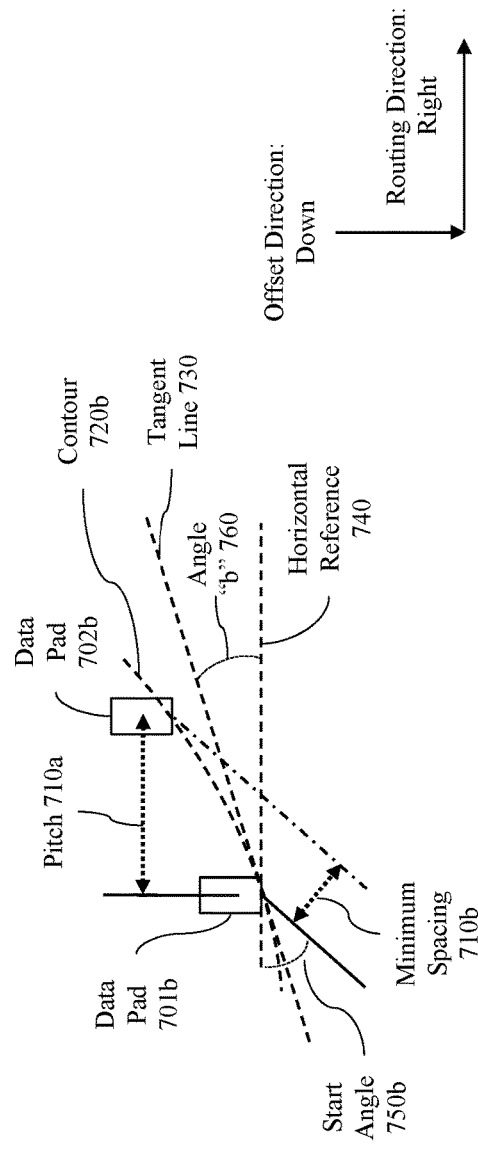

In some embodiments, a starting angle of the selected path is determined at 508. One approach to generating a starting angle includes use of a minimum angle or a tangent to the contour at the point of intersection with the corresponding data pad. FIGS. 7A-7B below illustrate a determination of a starting angle. In some embodiments, only a single starting angle is determined for each cluster. In some embodiments, multiple starting angles are determined based on a triggering analysis (e.g. based on a determining of a threshold distance between parallel interconnection segments. In some embodiments starting angles are determined for each data pad. In some embodiments, the starting angle depends on the pitch between adjacent data pads and a minimum spacing.

At 510, an interconnection segment is routed between the integrated circuit edge and the routing point using the starting angle. Specifically, an interconnection segment is routed between the routing point and the integrated circuit edge, at the angle determined at 508. The edge is essentially a projection from the integrated circuit pad that is parallel to the data pad projection. This projection starts at the integrated circuit and has a length determined by where it intersects with the interconnection segment. Subsequent interconnection segments run parallel to the previously generated interconnection segment until a new angle and interconnection segment is needed to interconnect to another routing point. This process will be illustrated below at least in regard to FIGS. 8A-8E.

In some embodiments, at 509, guide lines are generated that are perpendicular to corresponding interconnection segments. The guide lines are used to enforce spacing between parallel interconnection segments. Specifically, where a guide line intersects two adjacent interconnection segments, a distance is determined. This distance is compared to a minimum spacing to determine/ensure that the adjacent parallel interconnection segments are not so close as to violate the minimum spacing requirements. Guide lines are discussed further below, at least in regard to FIGS. 9-11.

In some embodiments, at 511, junction lines are generated. Junction lines are created such that they bisect angles between two adjacent interconnection segments for the same interconnection. As will be illustrated, this helps to simplify the problem of routing multiple adjacent interconnection segments to both identify a routing point and, in some cases, to help catch some routing issues as will be explained below in regard to FIGS. 9-11.

At 513, it is determined whether there are further integrated circuit pad and data pad pairs to be processed in the currently selected cluster. If there are additional pairs, the process returns to 504 where a next integrated circuit pad and data pad pair is selected. If there is not, then the process continues at 515 where it is determined if there are any clusters to be processed. If there are no further clusters to be processed, the flow ends at 516. Otherwise the process returns to 502 where another cluster is selected for routing.

FIGS. 6A-6B illustrate the generation of data pad projections and routing points as described for 506 in FIG. 5 according to some embodiments. Generally, the projection moves the interconnection segment that is to be generated to connect to the data pad away from the data pad. This helps to minimize spacing violations for interconnection segments that are too close to a data pad that those interconnection segments are not supposed to be in contact with.

FIG. 6A provides an illustration of projections from data pads that are aligned along a contour that is horizontal. Specifically, data pad 601*a* and 602*a* are both arranged along contour 620*a* which is a horizontal line. The projections from each data pad, 611*a* and 612*a* are parallel to each other and extend the same distance below each data pad. In some embodiments, the length of the projection is set to avoid spacing violations between interconnection segments that run near the data pad but are not otherwise supposed to be connected. For instance, the projection length might comprise some multiple of the minimum spacing (e.g. 0.5, 1, 1.5, 2) to help to avoid each subsequent interconnection segment being too close to a corner or edge of the data pad. As illustrated here, the projection starts at the edge of the data pad and is moved in the offset direction.

FIG. 6B provides an illustration of projections from data pads that are aligned along a contour that is curved. Specifically, data pad 601*b* and 602*b* are both arranged along contour 620*b* which is an arc. The projections from each data pad, 611*b* and 612*b* are parallel to each other and extend the same distance below each data pad in the offset direction. As before, in some embodiments, the length of the projection is set to avoid spacing violations between interconnection segments that run near the data pad but are not otherwise supposed to be connected. For instance, the projections 611*b* and 612*b* might have equal lengths set, such that a straight interconnection segment routed between the initial routing point 671*b* and 672*b* would not violate the minimum spacing requirement.

FIGS. 7A-7B illustrate the determination of a starting angle of an interconnection segment as described for 508 in FIG. 5 according to some embodiments. Generally, the start angle depends on at least the distance between data pads and the minimum spacing.

FIG. 7A illustrates two data pads that are arranged along a horizontal contour. Data pad 701*a* and data pad 702*a* have a distance between their center points which is labeled pitch 710*a*. Additionally, the starting angle 750*a* is specified in relation to a horizontal line that here happens to be the same as the contour 720*a*. Additionally, the starting angle is set such that if two adjacent interconnection segments where routed to data pad 701*a* and data pad 702*a* respectively, those interconnection segments would have at least the minimum spacing distance between them. In some embodiments, the start angle is determined based on the equation sin(a)=pitch/minimum_spacing, where "a" is the starting angle 750*a*.

FIG. 7B illustrates two data pads that are arranged along a curved contour. Data pad 701*b* and data pad 702*b* have a distance between their center points which is labeled pitch 710*a* as in FIG. 7A. Additionally, the starting angle 750*b* is specified in relation to a horizontal line that intersects with the data pad for which the starting angle is being determined. However, in contrast to FIG. 7A, the contour in FIG. 7B happens to be curved. In the case of a contour line that is not horizontal, the start angle is "a" plus "b" (angle "b" 760), where "a" is determined as discussed above and "b" is determined based on the tan(b), see tangent line 730, at the center point of the data pad 701*b* and a horizontal reference 740.

In some embodiments, the start angle is only computed for the first data pad in a cluster. In some embodiments, the start angle is determined for each data pad in a cluster.

FIGS. 8A-8E illustrate the routing of interconnection segments between integrated circuit edges and routing points as described for step 510 in FIG. 5 according to some embodiments. Generally, FIGS. 8A-8E illustrate the routing of interconnection segments between three integrated circuit (IC) pads and three data pads, where the offset direction is down, and the routing direction is to the right.

Figure 8A:
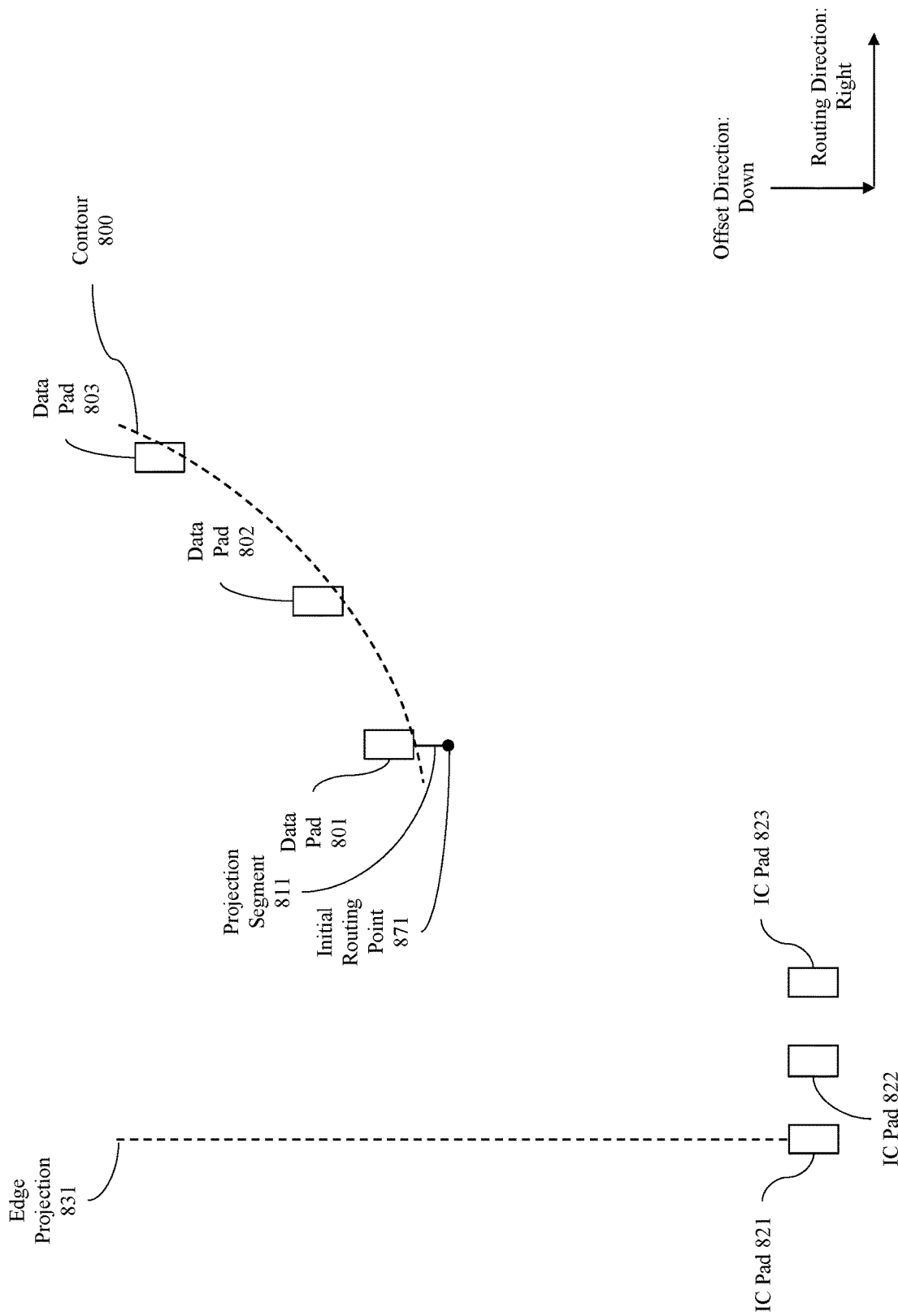
FIGS. 8A-8E illustrate the routing of interconnection segments between integrated circuit edges and routing points as described for step 510 in FIG. 5 according to some embodiments.

FIG. 8A includes integrated circuit (IC) pads 821-823, data pads 801-803, and a curved contour 800. For reference, an edge projection 831 is illustrated along the same axis as the projection segment 811 having the initial routing point 871.

Figure 8B:
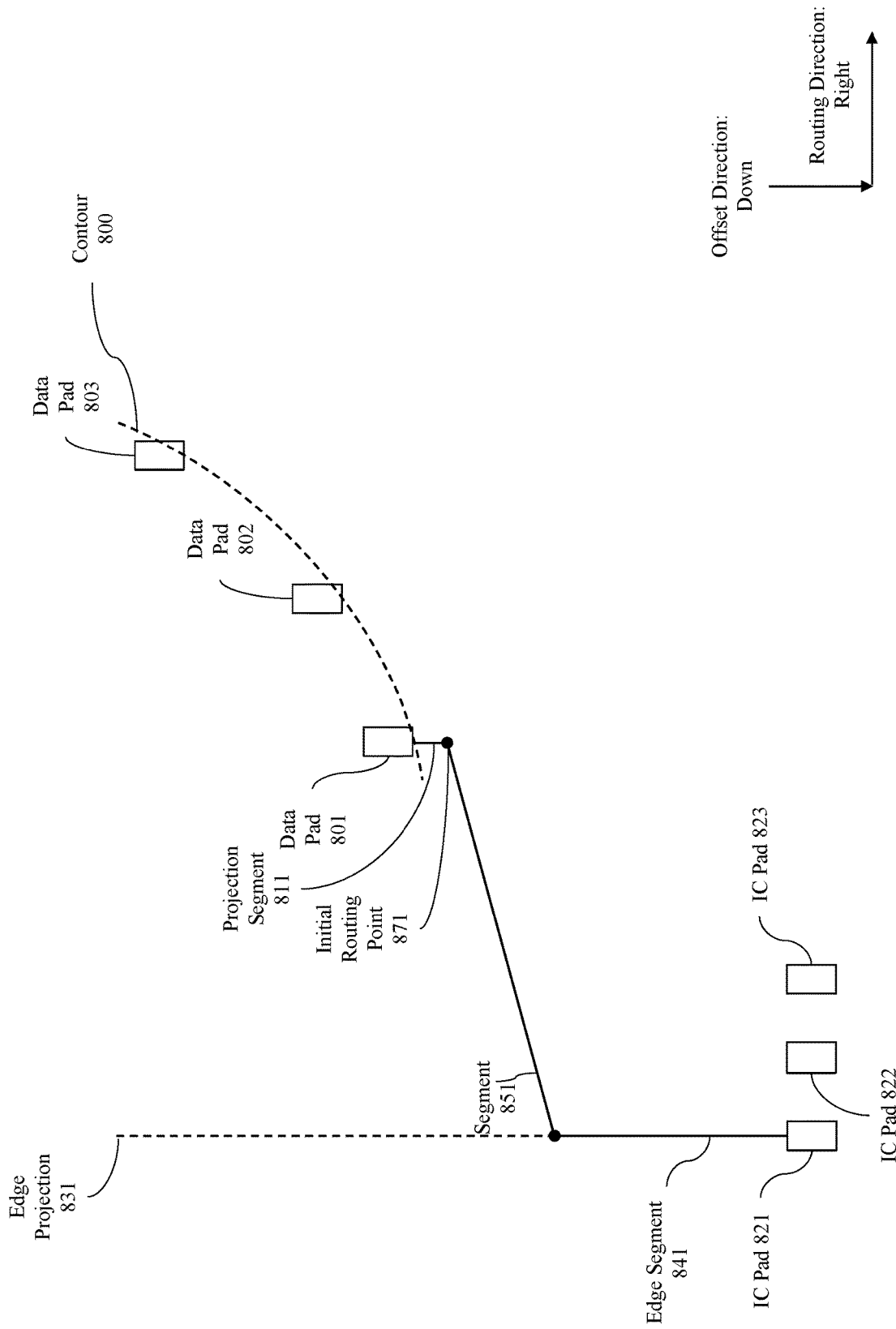

FIG. 8B illustrates the connection of the IC pad 821 to the data pad 801. As can be seen from the illustrations, the connection comprises three parts. A first part (edge segment 841) that connects the IC pad 821 to the angled/first interconnection segment 851, a second part (segment 851) that connects the edge segment 841 to the initial routing point 871, and a third segment (projection segment 811) that extends from the data pad 801 to the initial routing point. In some embodiments, the data pad projection (projection segment 811) and the initial routing point are generated at 506 in any of the ways previously discussed. Subsequently, a starting angle is determined for interconnection segment 851 also as discussed above in regard to 508. Using the starting angle, a line can be drawn that intersects with the initial routing point 871 having the starting angle and also intersecting with the edge projection 831. The interconnection point between the interconnection segment 851 and the edge projection 831 is another routing point. Thus, the path can be represented by the routing points between each of its interconnection segments, between an interconnection segment and an edge, and an initial routing point.

In some embodiments, the internal representation and generation of the routing points and interconnection segments that connect them is generated without actually generating additional logical representations such as the edge projection 831. For example, internally an edge projection can be represented as a coordinate for an axis (e.g. as illustrated in the figure, an "x" or horizontal coordinate. The intersection point of the interconnection segment 851 with the edge projection can be represented as a coordinate using the x dimension and the remaining axis (e.g. the "y" or vertical coordinate for a 2-axis arrangement). For example, because the start angle is known, a right angle triangle can be drawn that includes all the angles (the start angle, a 90 degree angle, and an angle that is 90 degrees—the start angle), and includes the rise or run (here it is the run) of the triangle. Thus, by simply determining the missing rise or run (here it is the rise), the intersection of section 851 and with the edge projection can be determine mathematically—e.g. using the tangent of the start angle and the known rise or run to determine the unknown run or rise respectively. The previously unknown rise or run is then used to generate the routing points such as by using the previously unknown rise or run as an offset with respect to the initial routing point 871 to determine the missing value for the intersection with the edge segment. Finally, using these points a routing process can automatically generate any necessary interconnection segments to complete the interconnection path between the IC Pad 821 and the data pad 801 by connecting the points with routed interconnection segments.

Figure 8C:
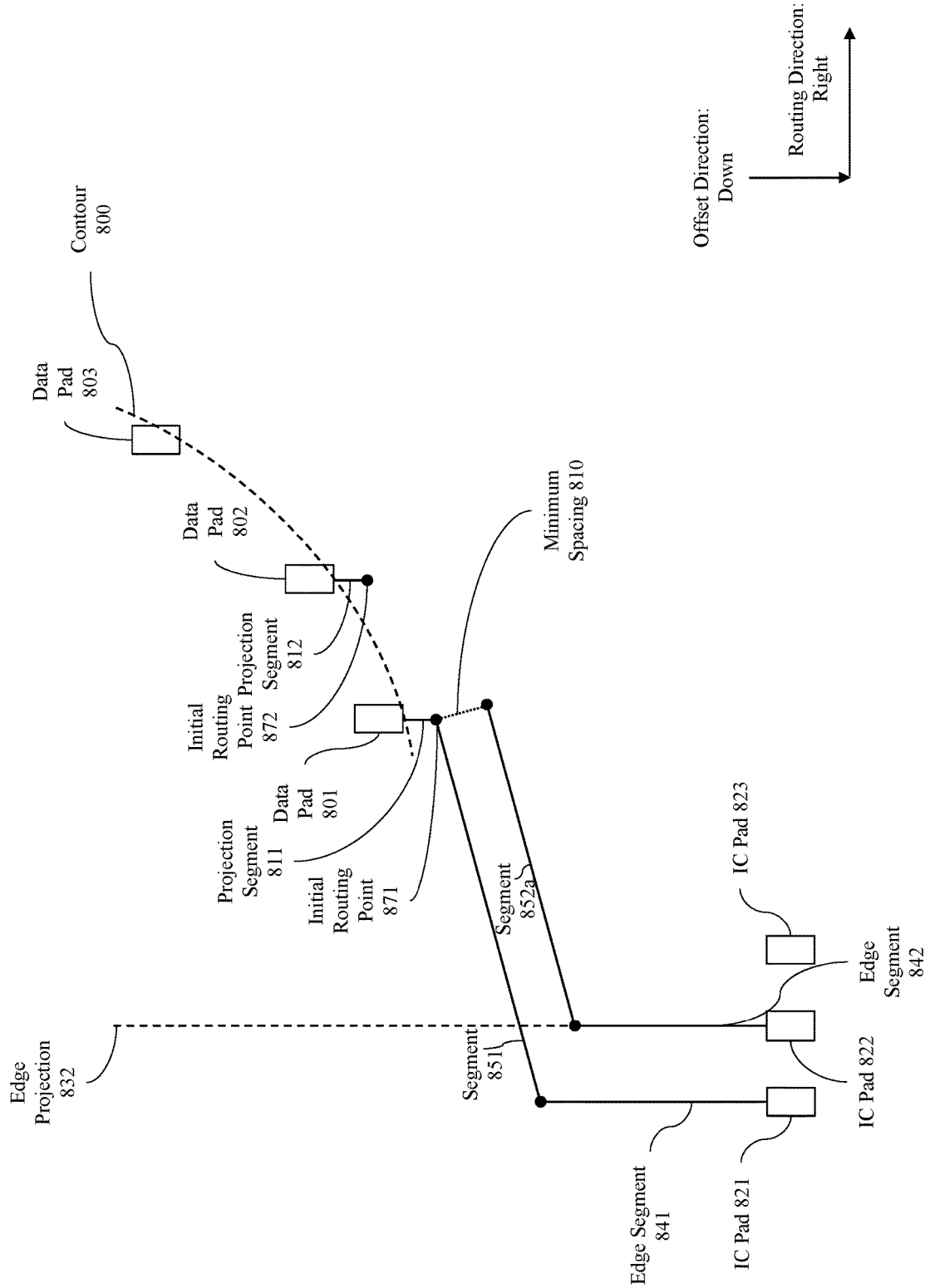

FIG. 8C illustrates the generation of the projection segment 812 for data pad 802 and the initial routing point 872 for the data pad 802. As previously discussed, this can be completed on a data pad by data pad basis as each data pad is selected, or this can be completed for all the data pads prior to routing and interconnection segments.

Regardless of how it is generated, the projection segment 812 for data pad 802 and the initial routing point 872 for the data pad 802 is generated. Additionally, an interconnection point between the edge projection 832 and the interconnection segment 852*a* is generated. This can be accomplished by generating a line that is parallel to the interconnection segment 851 and that has a minimum spacing (810) between it and the interconnection segment 851. Once generated it is a simple matter to determine where the interconnection segment 852*a* intersects with the edge projection as discussed above. As previously discussed, these interconnection segments may be represented by routing points up until the automatic routing process actually generates each complete interconnection path.

Figure 8D:
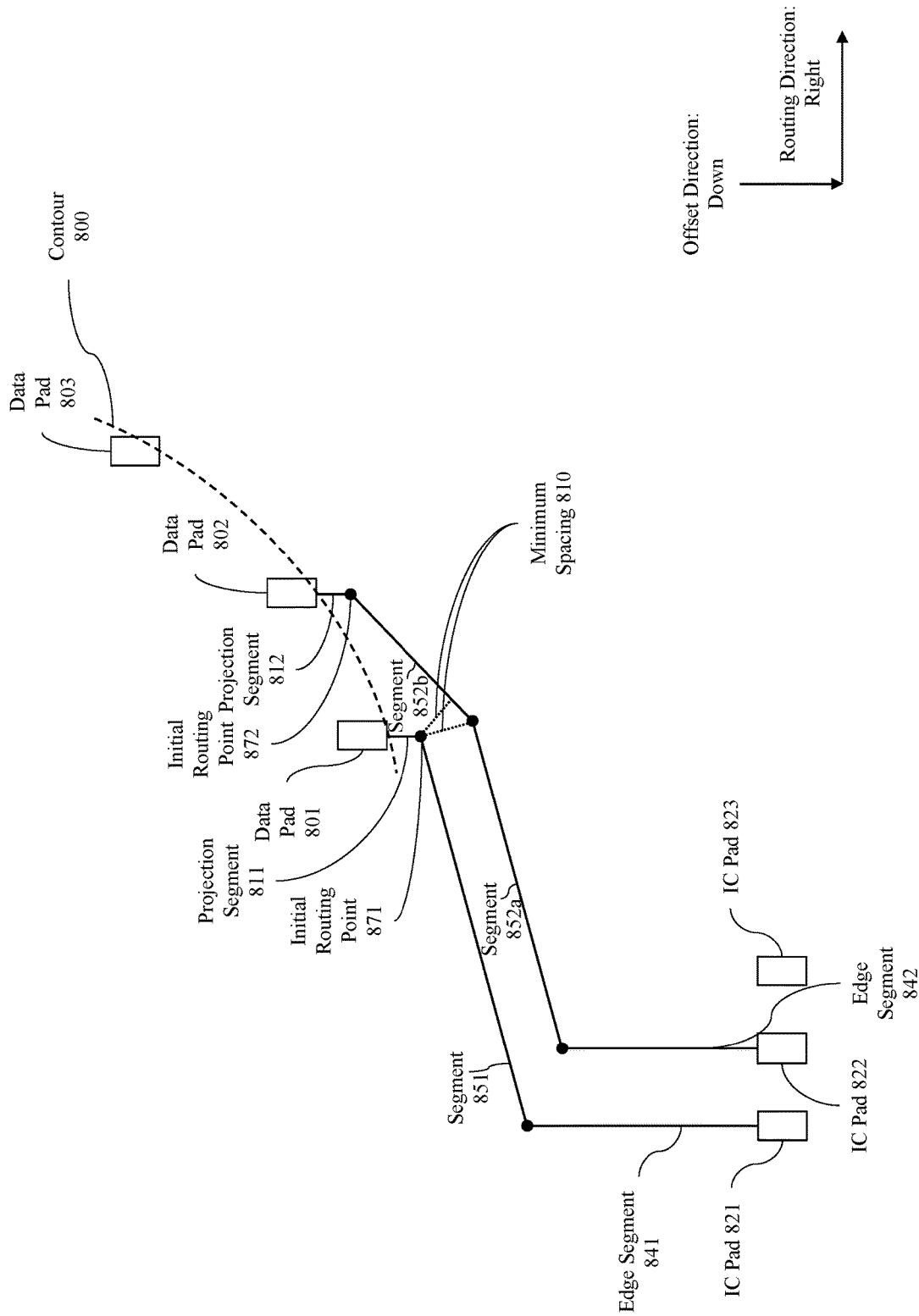

FIG. 8D illustrates the connection of interconnection segment 852*b* which connects the interconnection segment 852*a* to the initial routing point 872.

In some embodiments, the interconnection segment 852*b* is generated by connecting the initial routing point 872 and determining a point of intersection between interconnection segment 852*a* and 852*b* that does not violate minimum spacing rules. For example, a circle having a radius equal to the minimum required spacing plus the thickness of projection segment 811 and/or interconnection segment 851. Subsequently, a line that intersects with the initial routing point 872 and is tangential to an edge of the circle in the routing direction is drawn. The point where interconnection segment 852*a* and 852*b* would intersect (presuming they are long enough) is then identified as the routing point. In some embodiments, circles having a radius equal to the minimum spacing requirement can be drawn at the corners of the data pad 801. These circles represent the area that the interconnection segment 852*b* cannot intrude upon—e.g. a minimum spacing. Thus, a previously generated interconnection segment or representation thereof can be analyzed to determine if the interconnection segment (852*b*) intrudes upon the keep out area for the data pad 801. If the interconnection segment does intrude, then the same process above may be used to reroute interconnection segment 852*b* using the appropriate circle.

In some embodiments, the process starts by drawing a line that intersects with the initial routing point 872 and has a starting angle determined as discussed above in regard to 508. However, once such a line is generated then it will normally undergo analysis to determine if it intrudes upon any of the data pad keep out area or violates the minimum spacing requirements for the adjacent interconnection segment (851).

Figure 8E:
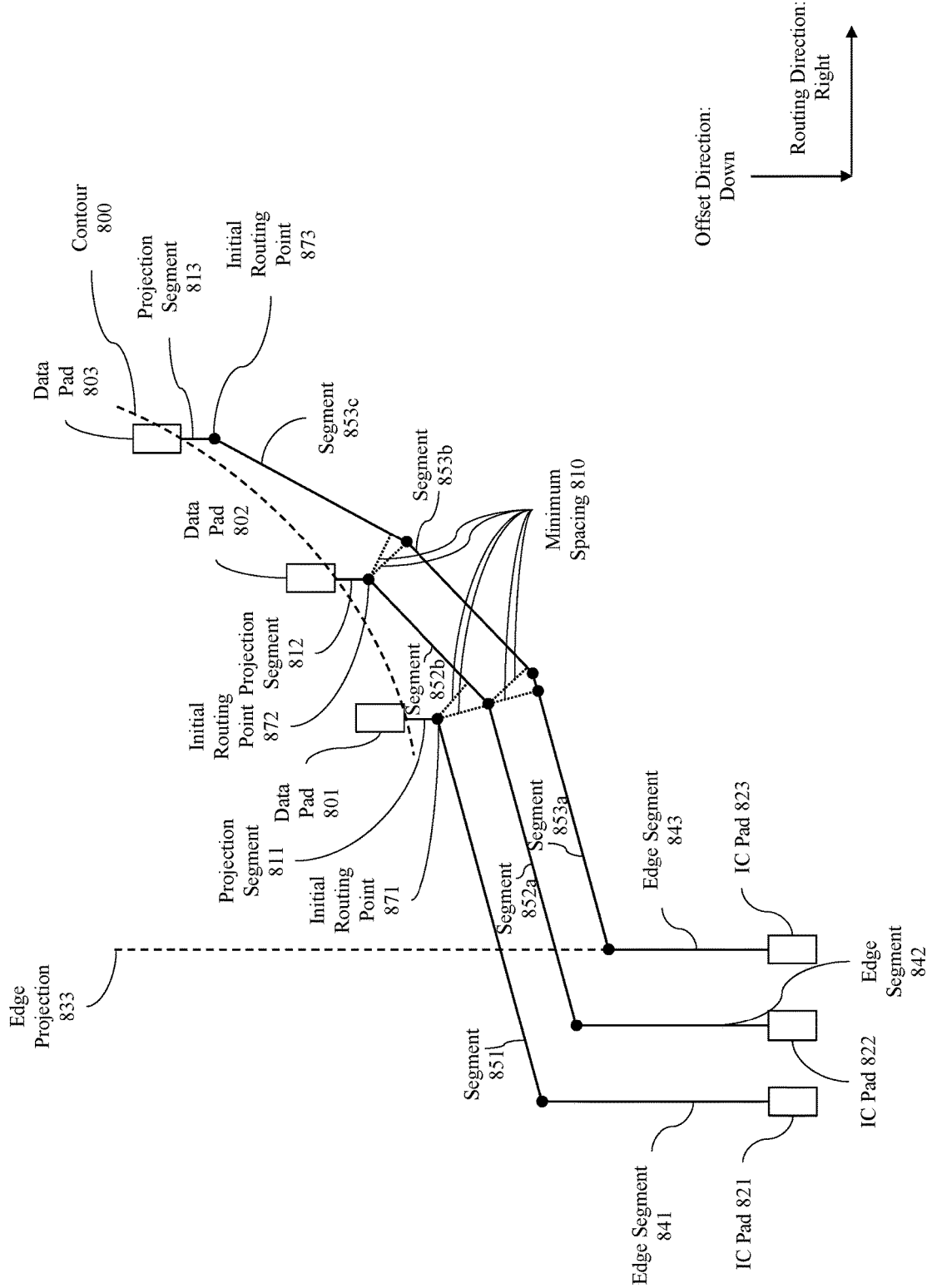

FIG. 8E illustrates the generation of the projection segment 813 for data pad 803 and the initial routing point 873 for the data pad 803. As previously discussed, this can be completed on a data pad by data pad basis as each data pad is selected or this can be completed for all the data pads prior to routing and interconnection segments. Additionally, FIG. 8E illustrates the generation of the interconnection segments 853*a-c*. Generally, the interconnection segments 853*a-c* are generated as discussed above. Specifically, interconnection segments 853*a-b* are generated in the same way that interconnection segment 852*a* is generated but uses data corresponding to 853*a-b* (e.g. interconnection segments 852*a* and 852*b*) instead of interconnection segment 851. Similarly, 853*c* may be generated in the same way as 852*b* but uses data corresponding to 853*c* (e.g. data pad 802, initial routing point 872, and interconnection segment 853*b*). In this way, any angle routing can be performed for data pads arranged along a contour that is not purely rectangular.

Figure 9:
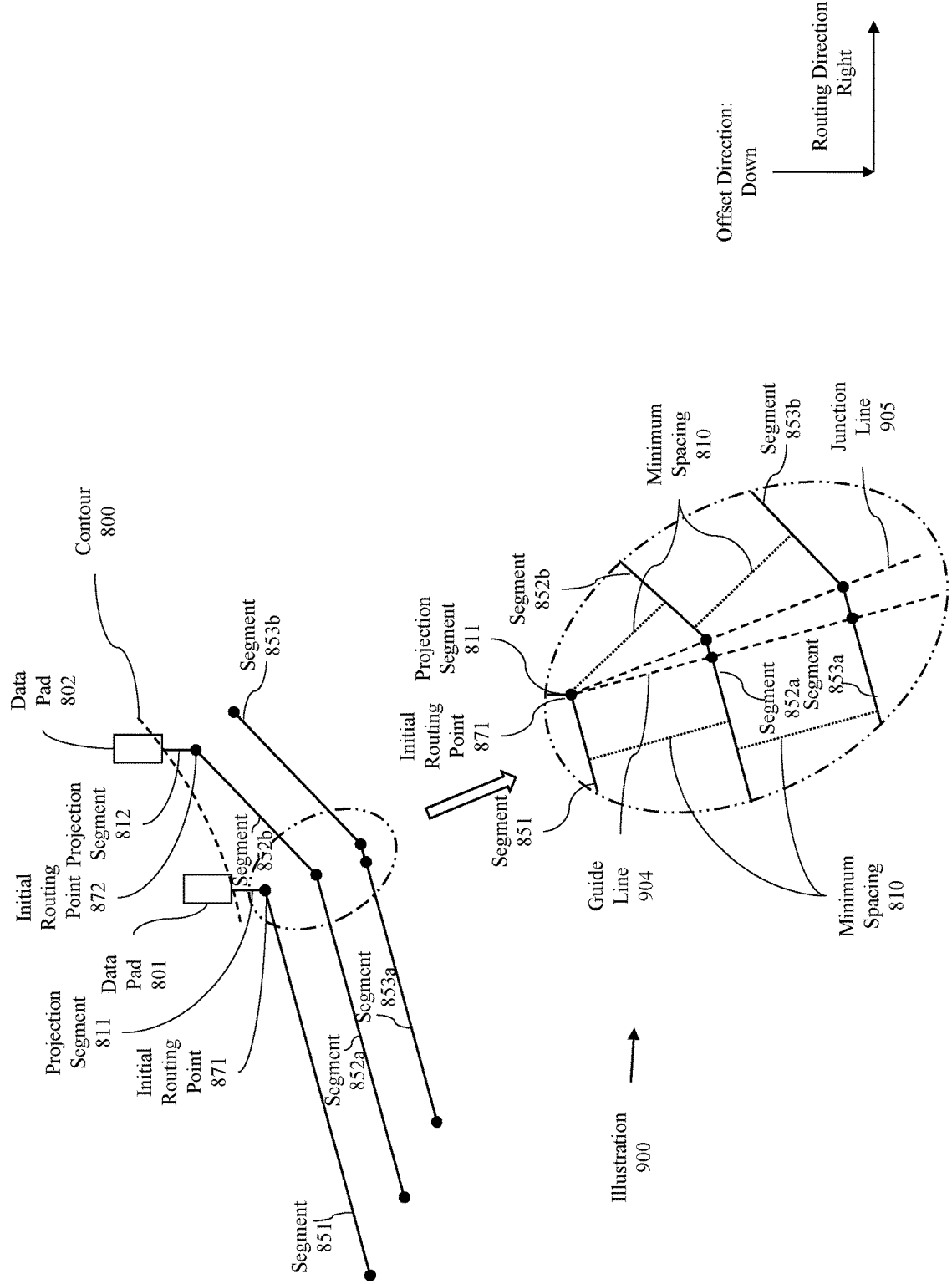
FIG. 9 illustrates the use of guide lines and junction lines for a portion of the circuit illustrated in FIG. 8E according to some embodiments.

In some embodiments, guile lines and/or junction lines can be used to simplify the routing process. FIGS. 9-11 provide some illustration of how guide lines and/or junction lines can be used.

FIG. 9 illustrates the use of guide lines and junction lines for a portion of the circuit illustrated in FIG. 8E according to some embodiments. The illustrated portion includes the interconnection segments 851, 852*a-b*, 853*a-b*, data pads 801 and 802, projection segments 811 and 812, initial routing points 871 and 872, and a portion of contour 800. The illustration 900 includes guide line 904 and junction line 905.

The guide line 904 runs perpendicular to the lines that it crosses. Because of this, the guide line is useable to enforce minimum spacing requirements (the spacing between two parallel lines is the shortest where a line that intersects with those lines is perpendicular). Thus, compliance with minimum spacing rules (e.g. minimum spacing 810) can be ensured when measurement of placed parallel interconnection segments performed along the guide line do not violate the minimum spacing requirement. Thus, for this example, the spacing between interconnection segments 851 and 852*a*, and between interconnection segments 852*a* and 853*a* can be measured at the point where the guideline intersects with the respective interconnection segments. Whereas the figure illustrates that the guide line has an origin point at the initial routing point, in some embodiments, the guide line is located/originates at a different location—e.g. from the center of the interconnection segment that connects to the initial routing point 871.

However, whereas guide lines are perpendicular to the interconnection segments they are relevant to, junctions lines bisect the angle between two adjacent interconnection segments for the same interconnection/path. For instance, the junction line 905 bisects the angle between interconnection segment 852*a* and 852*b*. Likewise, because interconnection segment 852*a* is parallel to interconnection segment 853*a* and 852*b* is parallel to interconnection segment 853*b*, then the junction line also bisects the angle between 853*a* and 853*b*. Furthermore, the junction line can be used to determine the intersection point between two lines after the junction line has been generated. For instance, during generation of the interconnection segments 853*a* and 853*b* or determination of the routing points thereof, a process can use the junction line to find the intersection point between two adjacent interconnection segments. This can save computing resources (e.g. memory, processing cycles, and I/O) because the system does not need to go through a process to generate ever larger and larger circles to determine where two adjacent sections intersect. Instead, interconnection segments can simply be extended until they intersect with the junction line.

As previously discussed, compliance of interconnection segment 852*b* with the minimum spacing requirement with regard to the initial routing point 871 can be determined as previously discussed. Additionally, though not illustrated, each interconnection segment that connects to an initial routing point (e.g. 872) can be associated with a guide line to ensure minimum spacing between it and any subsequent parallel interconnection segments.

Figure 10A:
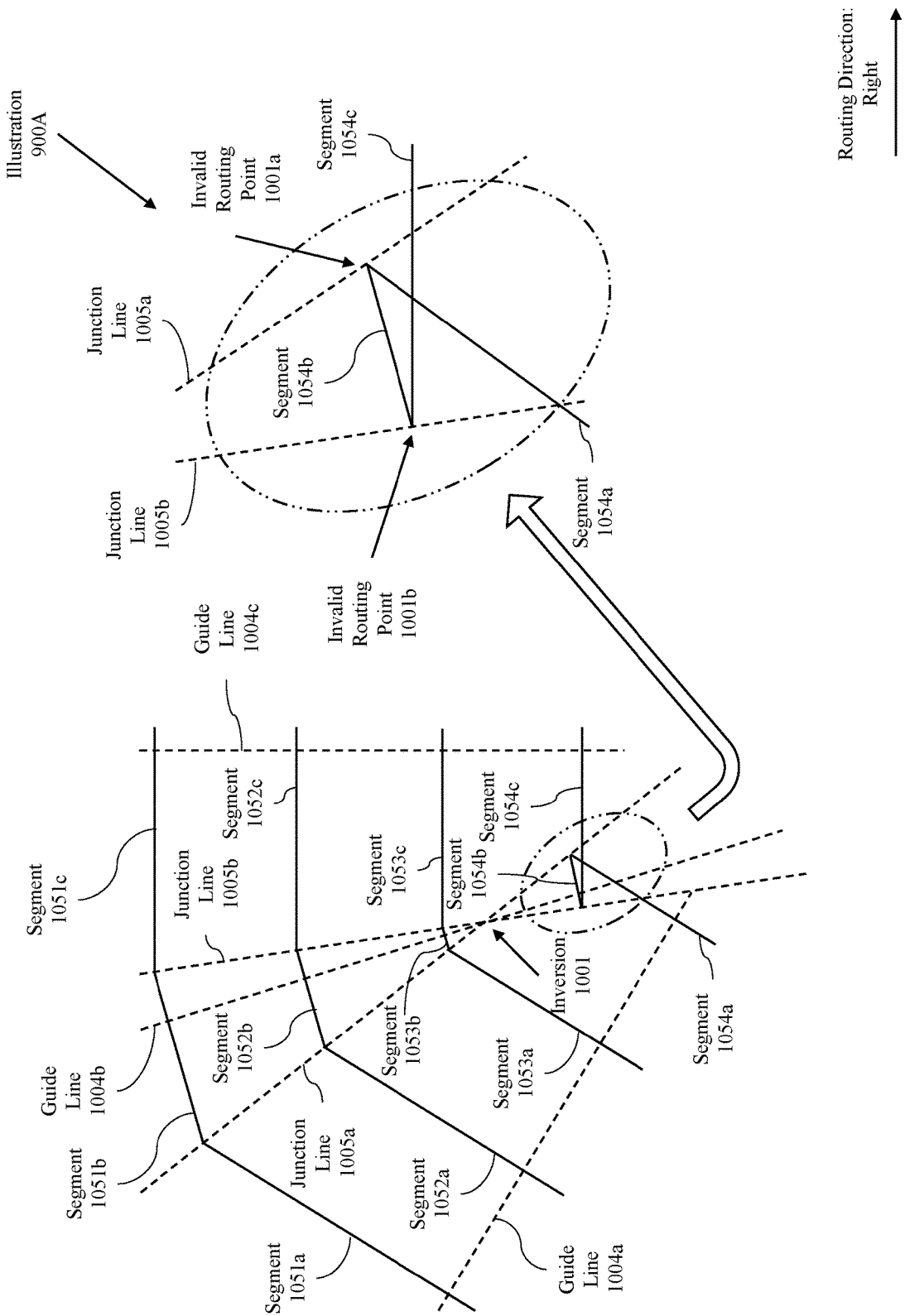
FIGS. 10A and 10B illustrate a problem and solution respectively associated with using guide lines and junction lines according to some embodiments.
Figure 10B:
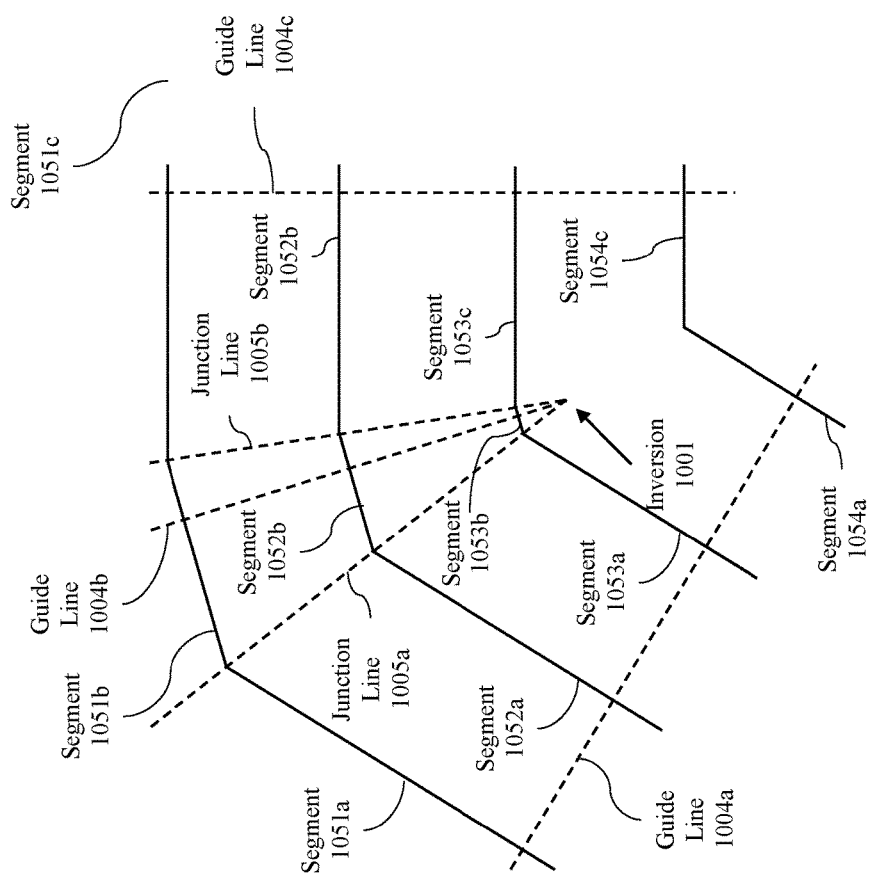
Figure 11:
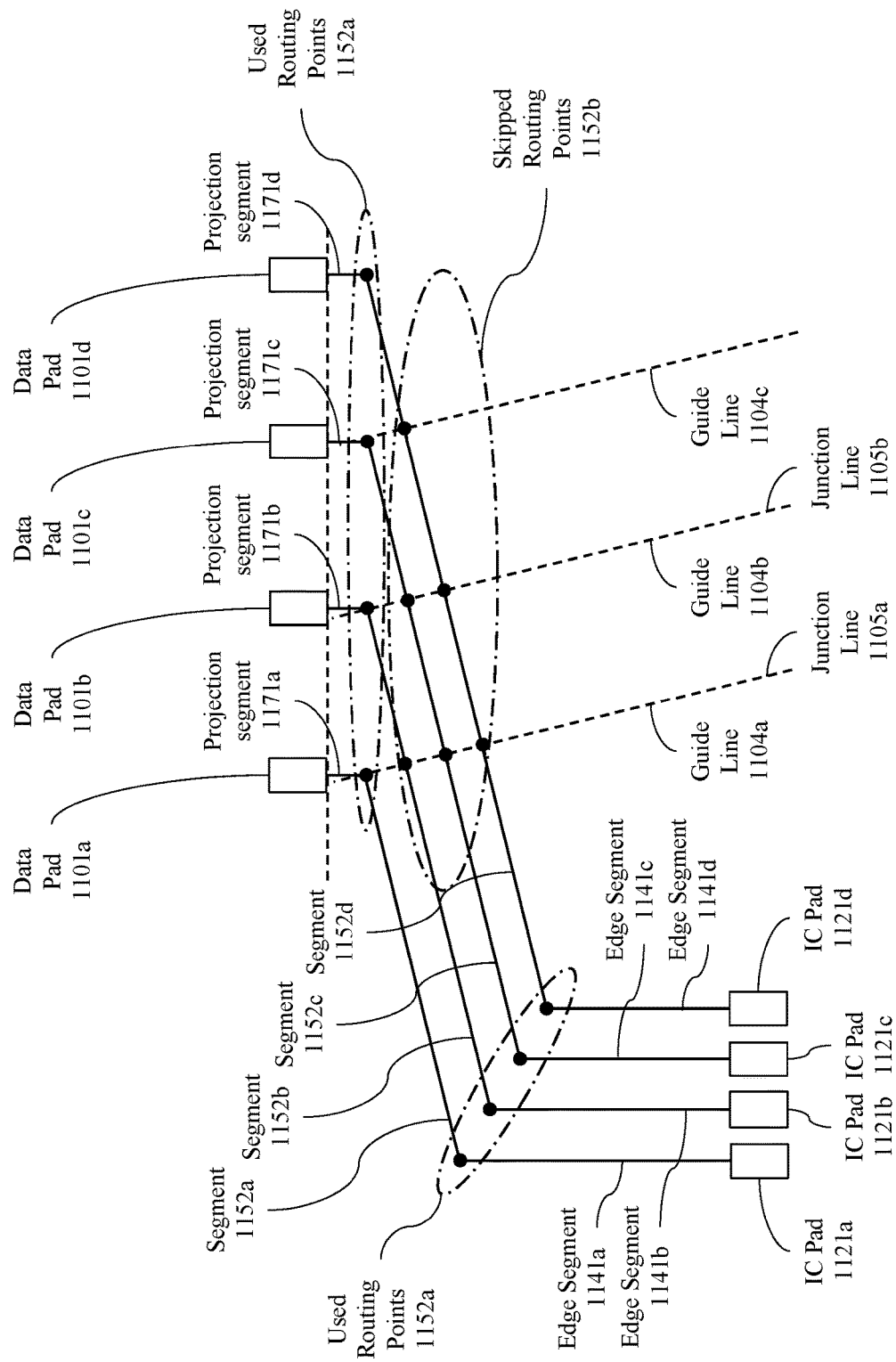
FIG. 11 illustrates the use of guide lines and junction lines where multiple interconnection segments are parallel according to some embodiments.

FIGS. 10A and 10B illustrate a problem and solution respectively associated with using guide lines and junction lines according to some embodiments. Specifically, FIG. 10A is directed towards explaining the problem, and FIG. 10B is directed towards a solution to the problem.

FIG. 10A illustrates an inversion that occurs in a routing space that might result in routing points that are invalid. FIG. 10A includes interconnection segments 1051*a-c*, 1052*a-c*, 1053*a-c*, 1054*a-c*, guide lines 1004*a-c*, and junction lines 1005*a-b*. As illustrated, each of the "a", "b", and "c" interconnection segments are parallel to the other "a", "b", and "c" interconnection segments and are therefore each associated with a guideline for ensuring that minimum spacing rules are complied with. Additionally, the illustration includes a junction line 1005*a* that is between the "a" and "b" interconnection segments, and junction line 1005*b* that is between the "b" and "c" interconnection segments. Additionally, the junction lines intersect within the routing space at 1001. This causes an inversion. Specifically, whereas junction line 1005*a* is, before the inversion, to the left of junction line 1005*b*, after the inversion junction line 1005*a* is to the right of junction line 1005*b*. If an interconnection segment is associated with a routing point along junction line 1005*a* and/or 1005*b*, those routing points will be invalid.

Close-up 900A provides a zoomed in view of routing that would be generated from the inverted junction lines. Specifically, use of the junction line 1005*a* would result in an invalid routing point 1001*a* that is above the interconnection segment 1054*c*. Similarly, use of the junction line 1005*b* would result in an invalid routing point 1001*b* that is in a direction contrary to the routing direction 1054*c*. As a result, the routing points would create a loop within a routing path that should not be there.

FIG. 10B illustrates a solution this problem by terminating the junction lines at the intersection point (inversion 1001). In this way, the junction lines after an inversion are not used to find routing points. Instead, the interconnection segments 1054*a* and 1054*c* are routed to the point where they intersect. Essentially, this removes one or more interconnection segments from the path constructed of the interconnection segments involved in the inversion. For example, the path previously constructed of interconnection segments 1054*a-c* (see FIG. 10A) no longer includes interconnection segment 1054*b*. Furthermore, in some embodiments, a new junction line can be created for the intersection of "a" and "c" interconnection segments. In some embodiments, inversions are identified, but the check for invalid routing points associated with those inversions are only checked for where the inversions occur within a routing space for the any angle routing process.

FIG. 11 illustrates the use of guide lines and junction lines where multiple interconnection segments are parallel according to some embodiments. FIG. 11 includes integrated circuit (IC) pads 1121a-d that are connected to corresponding data pads 1101a-d via edge segments 1141a-d and interconnection segments 1152a-d. Here, the interconnection segments 1152a-d are all parallel to each other. Specifically, each of data pads 1101a-d are equidistant from each other (e.g. have the same pitch) and are aligned on a horizontal axis. As a result of this particular arrangement, all of interconnection segments 1152a-d are parallel to each other and only a single interconnection segment is needed to connect an edge segment to a projection segment.

In one embodiment, the process operates by identifying parallel guide lines. Specifically, where adjacent guide lines are parallel to each other, the later generated guide line may be omitted. As illustrated, guide line 1104a is parallel to guide line 1104b. Thus, guide line 1104b can be omitted. Similarly, guide line 1104a is parallel to guide line 1104c.

Similarly, if the guide lines are parallel, that means that the interconnection segments are parallel. However, adjoining parallel interconnection segments can be represented by a single line. Thus, because guide line 1104a is parallel to guide line 1104b and to guide line 1104c, junction lines 1105a-b can be omitted when it comes to generating routing points. Therefore, any routing points that would have otherwise been generated in association with junction lines 1105a-b can be skipped (see 1152b). However, prior routing points will continue to be used when the correspond to connections are not to parallel line interconnection segments (see used routing points 1152a).

In some embodiments, if a junction line is found to be bisecting an angle between two interconnection segments that is 180 degrees, then the junction line is also unnecessary. This is because junction lines are used to identify the intersection point between two adjacent interconnection segments having different orientations or angles. However, if both interconnection segments are at the same angle, then the junction line is unnecessary as only a single interconnection segment needs to be used to encompass both the first interconnection segment and the second interconnection segment.

Figure 12A:
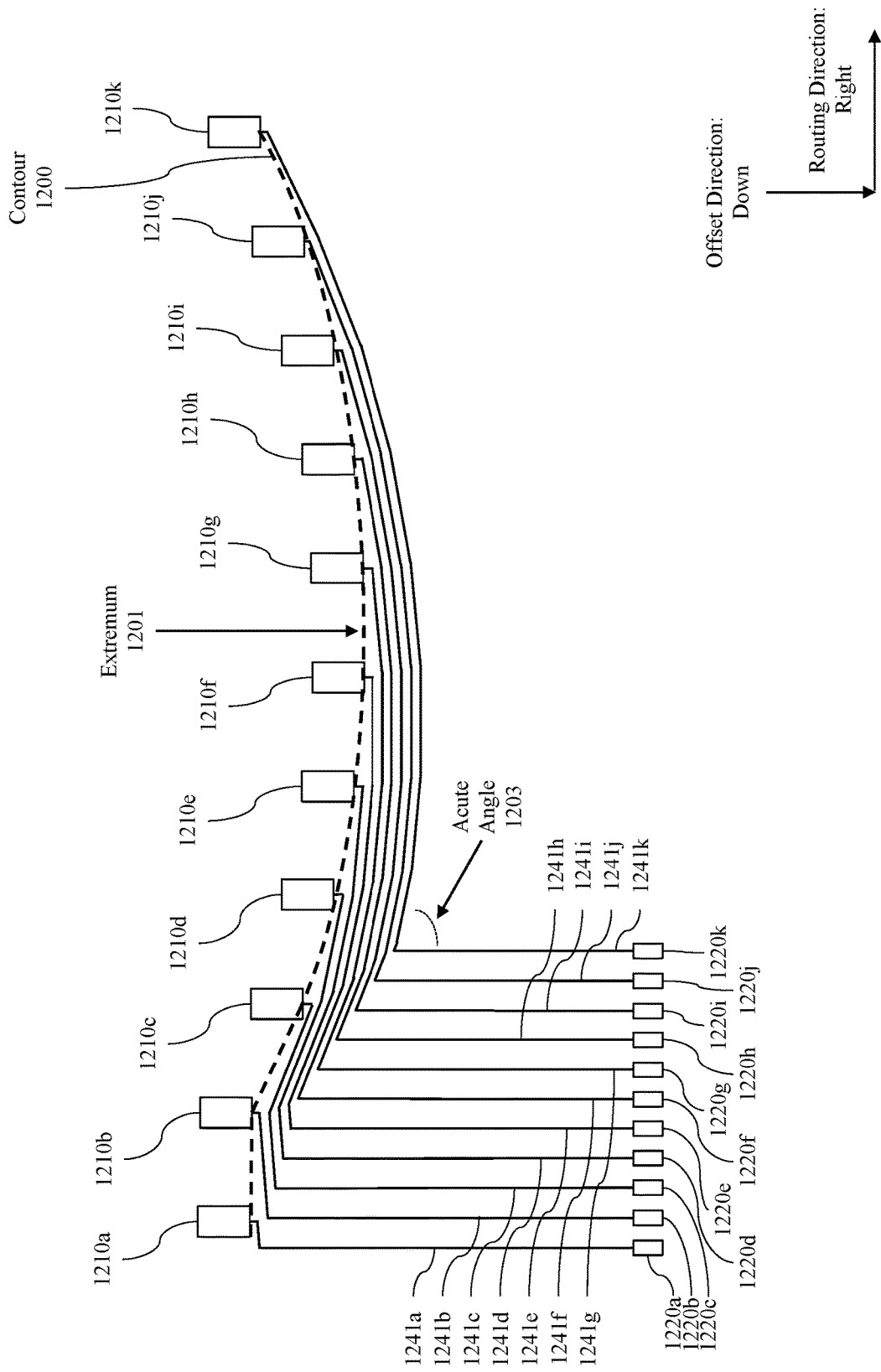
FIG. 12A-12C illustrate routing of paths between integrated circuit pads and data pads where an extremum exists according to some embodiments.
Figure 12B:
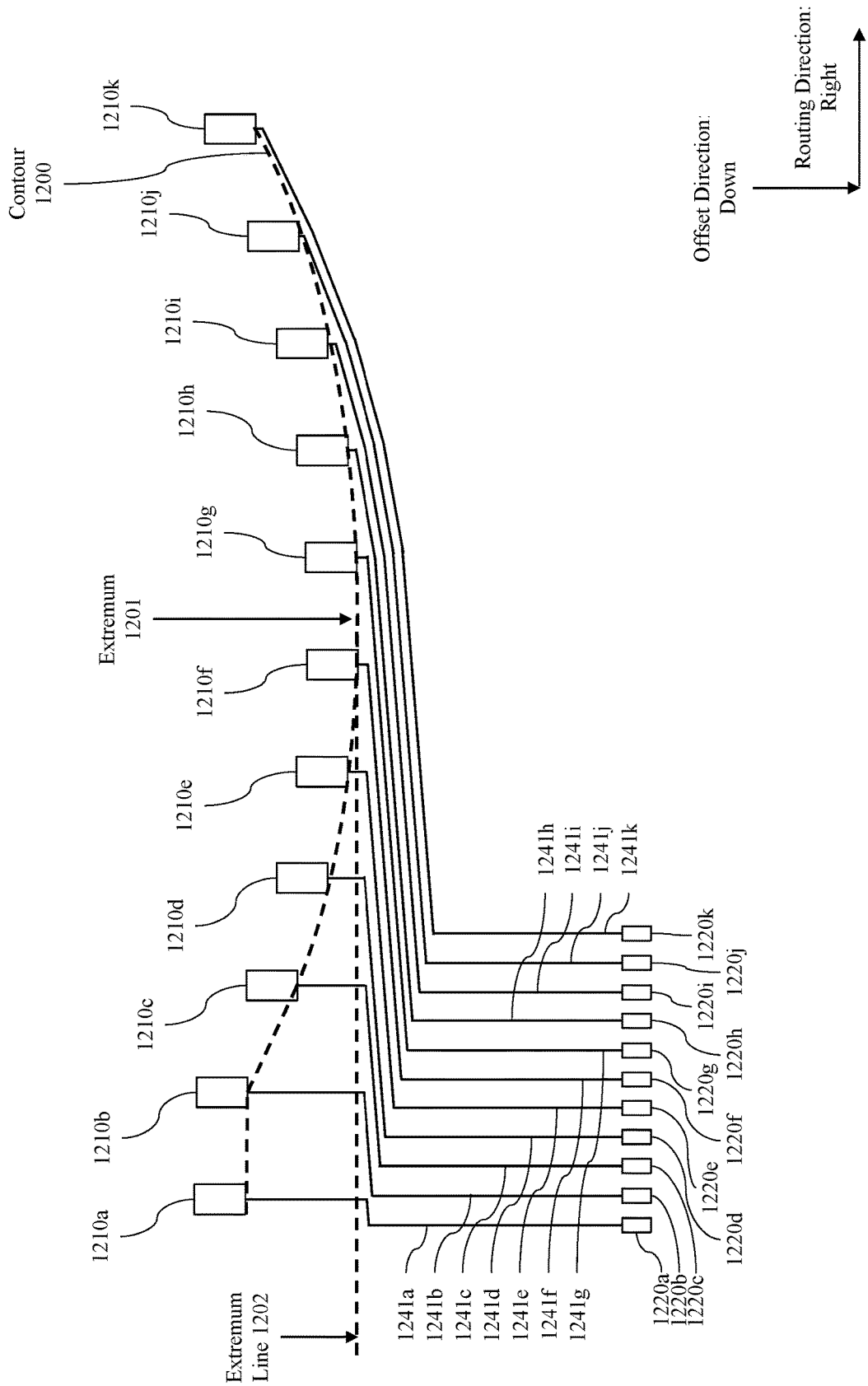
Figure 12C:
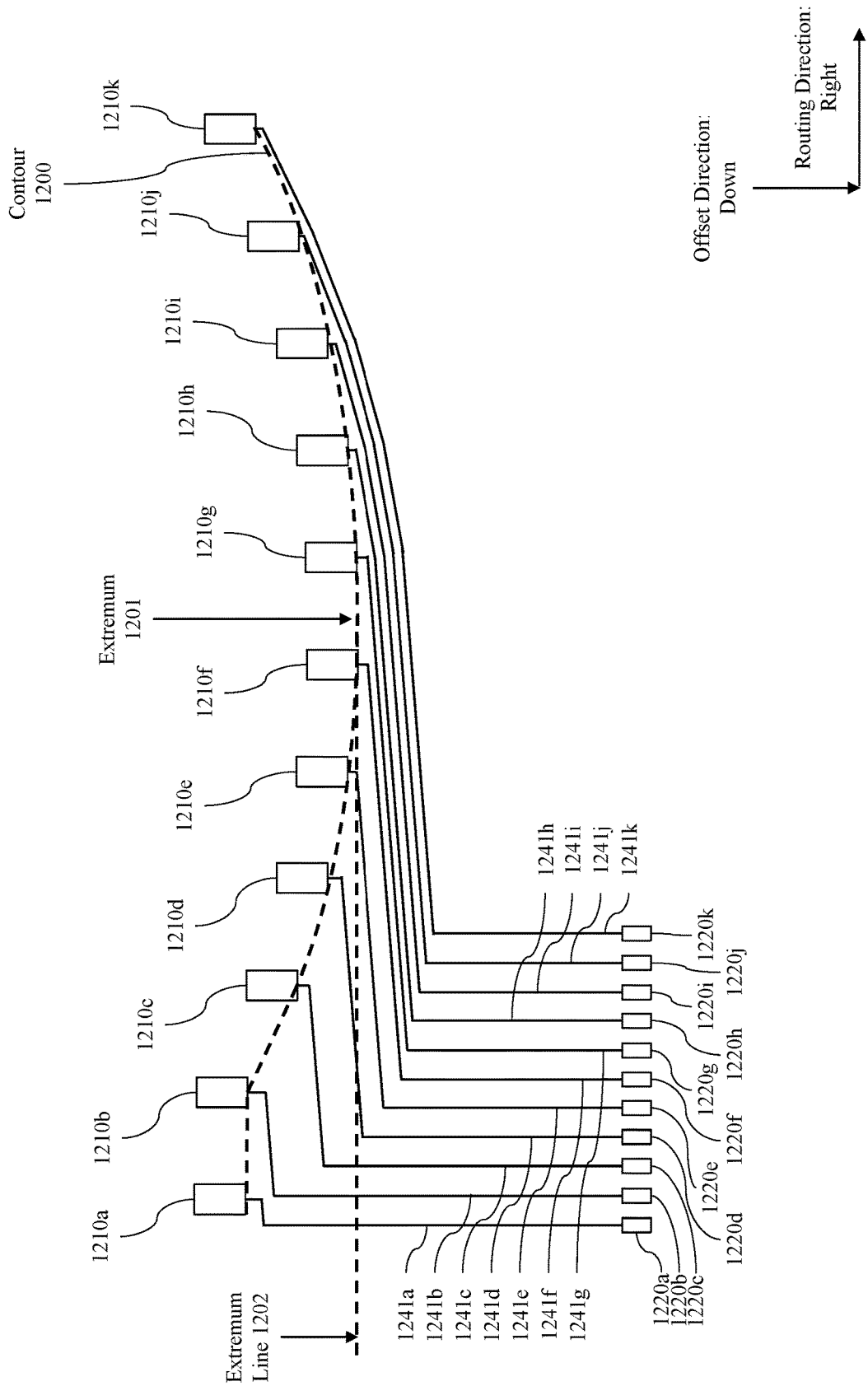

FIG. 12A-12C illustrate routing of paths between integrated circuit pads and data pads where an extremum exists according to some embodiments.

FIG. 12A includes integrated circuit (IC) pads 1220a-k, data pads 1210a-k, and paths 1241a-k consisting of multiple segments, where each path connects corresponding IC pads and data pads. As can be seen from the illustration, an extremum 1201 exists along the contour 1200. An extremum is an point of a contour that is farther in the offset direction than immediately adjacent portions of the contour on both sides of the point. As illustrated, this extremum is located between data pads 1210-a-f and 1210g-k. This results in multiple interconnection segments that are created that appear to provide a small area benefit (because the paths follow the contour as much as possible) but provide a detriment because some of the traces are longer that might otherwise be necessary and because routing becomes more complex due to the additional interconnection segments. In some embodiments, an extremum is identified from the existence of an acute angle (see 1203) in an already routed set of interconnections. In some embodiments, an extremum is identified by analyzing the contour (e.g. 1200) and/or the position of the data pads (e.g. 1210a-k).

FIG. 12B illustrates the modification of the contour with an extremum line and some corresponding changes. Specifically, FIG. 12B illustrates an extremum line 1202 that runs parallel to the routing direction (or perpendicular to the offset direction) intersects with the contour at the extremum 1201. As can be seen from the illustration, the extremum line 1202 is only generated for the side of the extremum 1201 that is the opposite of the routing direction (e.g. from an origin point of the cluster to the extremum point).

Additionally, in order to account for the extremum line 1202, the line is treated as a new contour edge and thus data pads 1210a-f are extended to the same level below the extremum line 1202. As a result, routing of the paths 1241c-k is simplified, because fewer interconnection segments (and thus fewer routing points, guide lines, and junction lines) are needed to connect the corresponding elements.

FIG. 12C illustrates the return of the data pad projections and initial pointing points to there original location according to some embodiments.

For instance, in some embodiments it may be preferred to return the data pad projections to their prior lengths. Thus, the edge segments are lengthened while the projection segments are shortened, and any interconnection segments are moved in a corresponding manner. As will be seen below, this may be helpful for resistance balancing because more zig zags can be inserted to adjust the resistance of these paths. As illustrated, the interconnection segments of paths 1241a-f are moved up towards the data pads to further simply the routing process by shrinking the extensions down to the prior projection length before the extremum was created and adjusted for, without adding new interconnection segments.

Figure 13A:
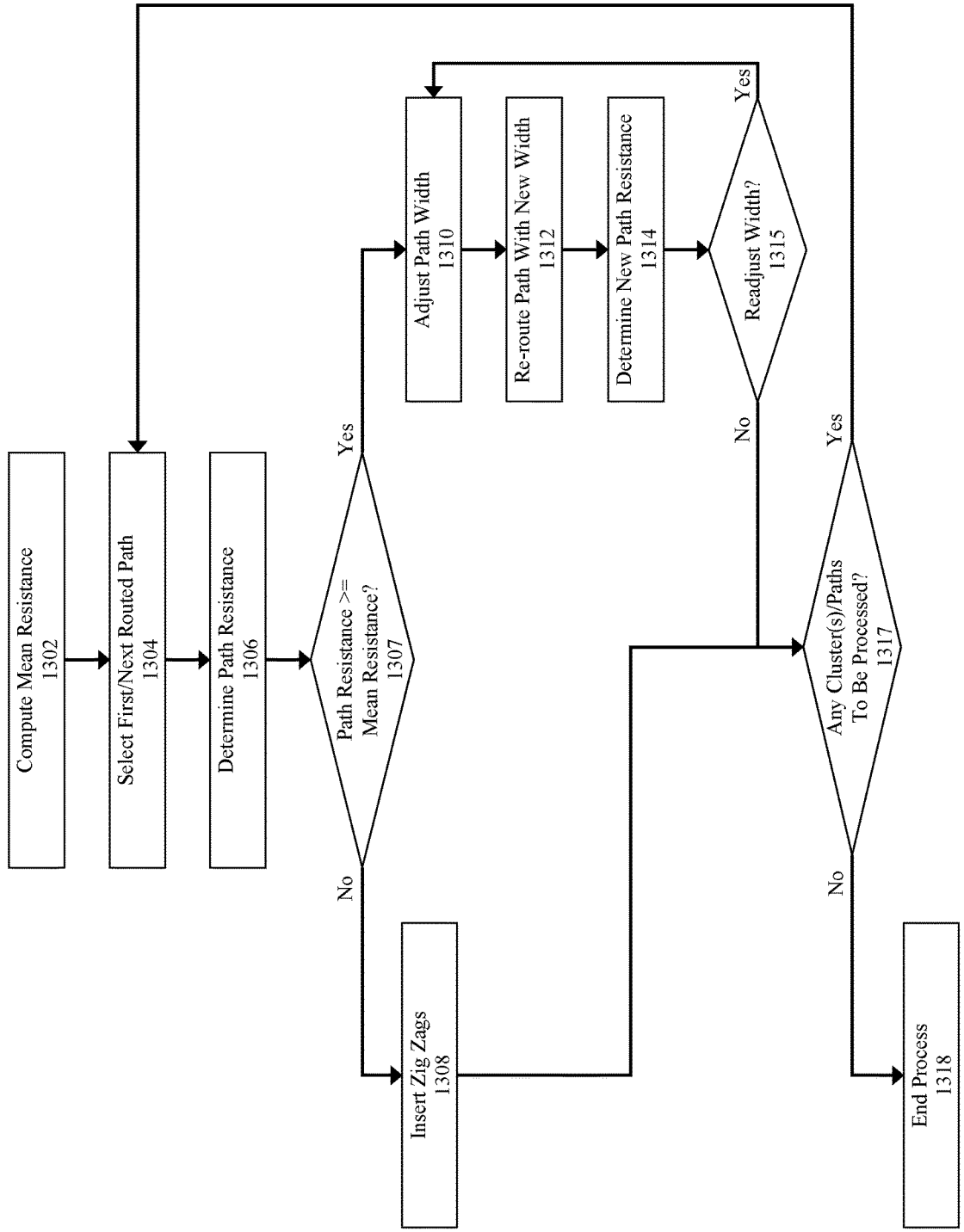
FIG. 13A illustrates a flow of an approach to perform resistance balancing 208 in FIG. 2 according to some embodiments.

FIG. 13A illustrates a flow of an approach to perform resistance balancing 208 in FIG. 2 according to some embodiments. Generally, the process includes adding additional resistance to paths that are below an average resistance and decreasing the resistance of paths that are above the average resistance.

The process starts at 1302 where the mean resistance is determined. For example, the interconnections of a circuit that span one or more clusters of integrated circuit pads and data pads are analyzed to determine the mean resistance by adding all the resistances together and dividing the sum by the number of paths.

At 1304 a first/next routed path is selected for processing. Generally, this occurs in an order that corresponds to the routing direction of the cluster where adjacent paths are selected one after the other for processing. At 1306 the path resistance is calculated for the selected path—e.g. by adding the series resistance of each segment that makes up a path together.

If the path resistance is determined to be less than or equal to the mean resistance at 1307, then a number of zig zags interconnection segments are inserted at 1308. For instance, one or more rules are used to determine the number of zig zags interconnection segments to be inserted—e.g. the number required to meet but not exceed the mean resistance, the number required to exceed the mean resistance, or the number required to exceed the mean resistance. However, in some embodiments, the number of zig zags to be inserted is greater than the number of zig zags that can be inserted into a given area. In this event, a best effort adjustment is made to insert as many as can be inserted without exceeding the available area. In some embodiments, a path with a resistance equal to the mean resistance will not have any zig zags inserted. Generally, the added resistance for each zig zag or half zig zag is known for a given width on the current process.

If the path resistance is determined to be greater than the mean resistance at 1307, the path width is adjusted (widened) to lower the resistance. Subsequently, the path is re-routed with the new width at 1312. Here, because the width of the path is wider and thus closer to adjacent paths the same path with the new width would likely violate spacing requirements. Thus, the widened path is re-routed using the same techniques discussed above. At 1314 a new path resistance is determined for the path after it has been widened. Based on the new path resistance a determination is made at 1315 as to whether an additional adjustment needs to be made to the width. For instance, a threshold and/or an iteration limit may be applied in determining when a previously adjusted path should be adjusted again. Usually, one or two adjustments is sufficiently close to the mean resistance that further iterations are unnecessary. In some embodiments, re-routing the path with a new width also includes re-routing any paths that are in the routing direction from the re-routed path. In some embodiments, a determination that no further readjustments of the width for that particular path triggers the re-routing of any paths that are in the routing direction from the re-routed path.

At 1317 a determination is made as to whether any paths or clusters remain to be processed. If there are additionally paths or clusters, then the process returns to 1304. However, if there are no further paths or clusters then the process ends at 1318.

Figure 13B:
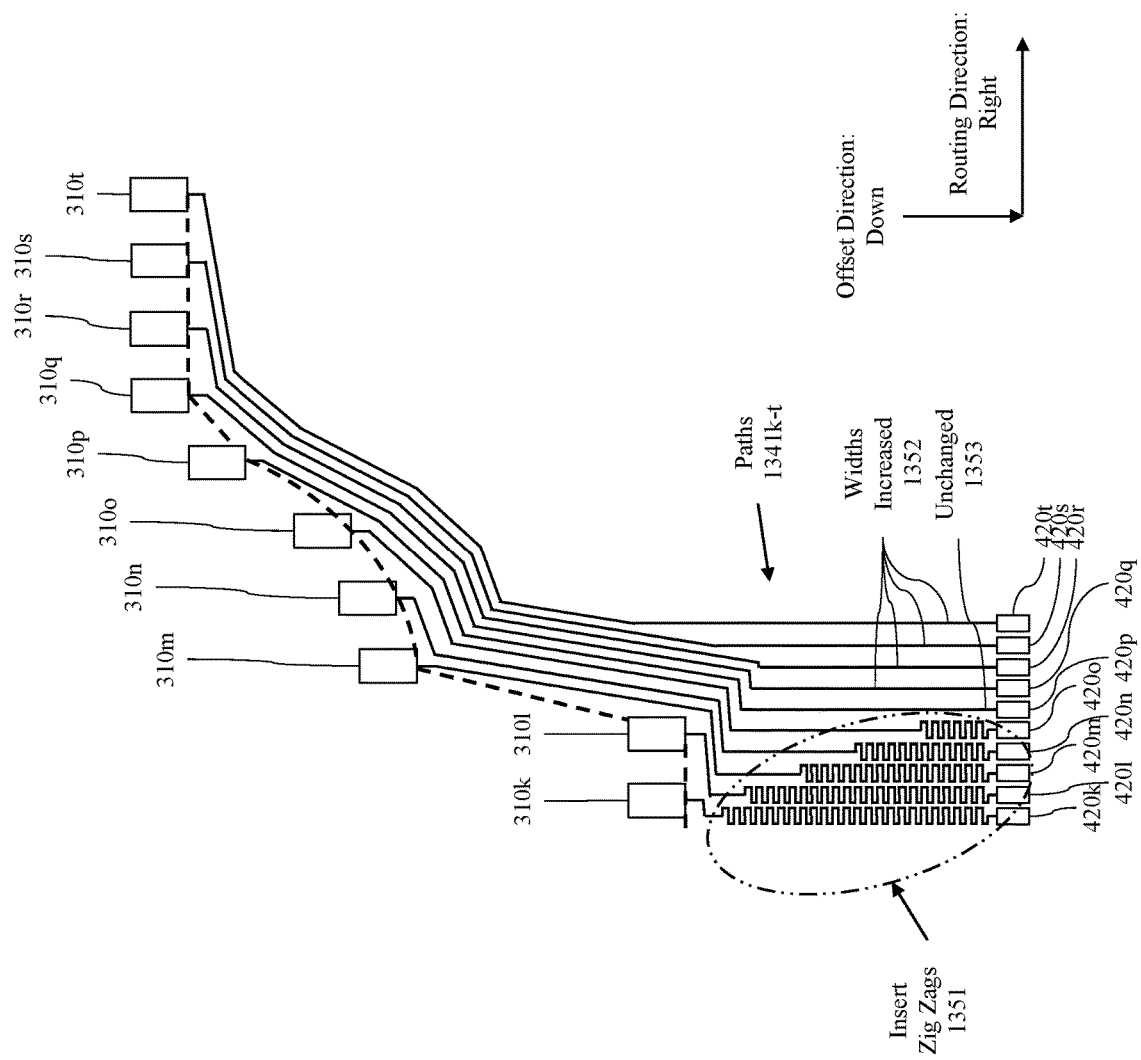
FIG. 13B illustrates a cluster that has been routed using the any angle routing illustrated herein and which has been modified to balance resistances as described in FIG. 13A according to some embodiments.

FIG. 13B illustrates a cluster that has been routed using the any angle routing illustrated herein and which has been modified to balance resistances as described in FIG. 13A according to some embodiments. Specifically, FIG. 13B provides an illustrative routing and resistance balanced set of paths for cluster 450b illustrated in FIG. 4B.

As illustrated, the figure includes integrated circuit pads 420k-t, data pads 310k-t, and paths 1341k-t. The first five paths 1341k-o have zig zags inserted (1351) where the shortest paths have the largest number of zig zags inserted and the number of zig zags decrease from there because subsequent paths are longer than the prior paths. In contrast, path 1341p is unchanged (1353)—e.g. because path 1341p has a resistance equal to the mean or such that it was determined to have no zig zags inserted and no path width modification. Finally, the widths of paths 1341q-t have their widths increase (e.g. to 7.36, 7.82, 8.36, and 8.57 respectively).

System Architecture Overview

Figure 14:
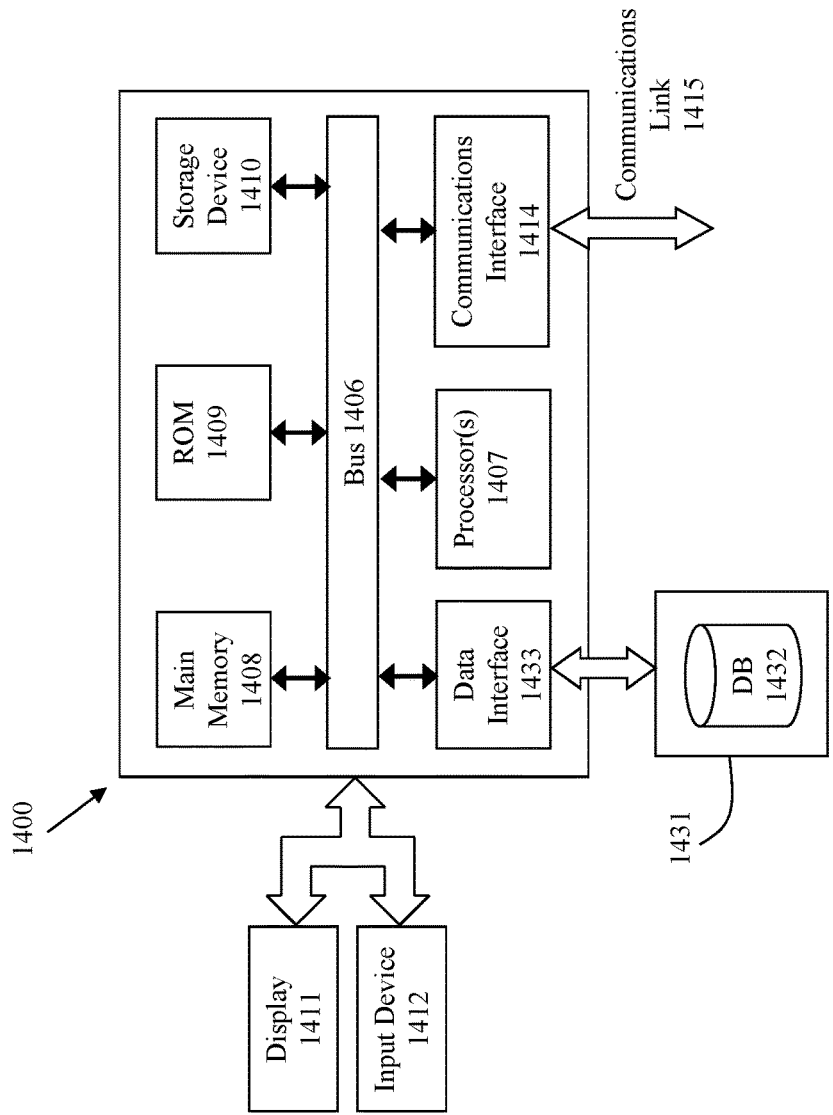
FIG. 14 shows an architecture of an example computing system with which the invention may be implemented.

FIG. 14 shows an architecture of an example computing system with which the invention may be implemented. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media include, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may communicate through a data interface 1433 to a database 1432 on an external storage device 1431.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A method, comprising:
   detecting contours for a plurality of data pads associated with a plurality of integrated circuit pads;
   clustering at least a subset of the plurality of data pads and a corresponding subset of the integrated circuit pads into one or more groups; and
   performing any angle routing based on at least a contour angle, wherein a first interconnection segment is generated having an angle based on at least the contour angle.

2. The method of claim 1, wherein clustering at least a subset of the plurality of data pads and corresponding integrated circuit pads into one or more groups comprise determining an offset direction and a routing direction.

3. The method of claim 2, wherein the one or more groups are identified based on a matching offset angle and a matching routing direction.

4. The method of claim 1, wherein performing any angle routing further comprises generating data pad projections and routing points.

5. The method of claim 1, wherein a starting angle is determined based on at least a pitch between two data pads of the plurality of data pads and a minimum spacing.

6. The method of claim 1, wherein a first interconnection segment and an adjacent second interconnection segment are parallel.

7. The method of claim 1, wherein a guide line is generated that is perpendicular to at least two adjacent interconnection segments, and the guide line is used to ensure that minimum spacing requirements are satisfied.

8. The method of claim 1, wherein a junction line bisects a first interconnection segment and a second interconnection segment for a first interconnection, and the junction line is used to identify an intersection point of a third interconnection segment and a fourth interconnection segment for a second interconnection.

9. The method of claim 1, further comprising performing resistance balancing for interconnections between the plurality of data pads and the plurality of integrated circuit pads.

10. The method of claim 9, wherein performing resistance balancing for the interconnections comprises:
   determining a mean resistance for the interconnections;
   inserting one or more zig zags into one or more paths with resistances below the mean resistance; and
   adjusting a width of one or more paths with resistances above the mean resistance, wherein adjusting a width of a first path of the one or more paths further comprises re-routing the first path.

11. A non-transitory computer readable medium having stored thereon a sequence of instructions which, when executed by a processor performs a set of acts, the set of acts comprising:
   detecting contours for a plurality of data pads associated with a plurality of integrated circuit pads;
   clustering at least a subset of the plurality of data pads and a corresponding subset of the integrated circuit pads into one or more groups; and
   performing any angle routing based on at least a contour angle, wherein a first interconnection segment is generated having an angle based on at least the contour angle.

12. The computer readable medium of claim 11, wherein clustering at least a subset of the plurality of data pads and corresponding integrated circuit pads into one or more groups comprise determining an offset direction and a routing direction.

13. The computer readable medium of claim 12, wherein the one or more groups are identified based on a matching offset angle and a matching routing direction.

14. The computer readable medium of claim 11, wherein performing any angle routing further comprises generating data pad projections and routing points.

15. The computer readable medium of claim 11, wherein a starting angle is determined based on at least a pitch between two data pads of the plurality of data pads and a minimum spacing.

16. The computer readable medium of claim 11, wherein a first interconnection segment and an adjacent second interconnection segment are parallel.

17. The computer readable medium of claim 11, wherein a guide line is generated that is perpendicular to at least two adjacent interconnection segments, and the guide line is used to ensure that minimum spacing requirements are satisfied.

18. The computer readable medium of claim 11, wherein a junction line bisects a first interconnection segment and a second interconnection segment for a first interconnection, and the junction line is used to identify an intersection point of a third interconnection segment and a fourth interconnection segment for a second interconnection.

19. The computer readable medium of claim 11, further comprising performing resistance balancing for interconnections between the plurality of data pads and the plurality of integrated circuit pads.

20. A system, comprising:
   memory comprising a sequence of instructions; and
   a processor that executes the sequence of instructions to perform a set of acts comprising:
      detecting contours for a plurality of data pads associated with a plurality of integrated circuit pads;
      clustering at least a subset of the plurality of data pads and a corresponding subset of the integrated circuit pads into one or more groups; and
      performing any angle routing based on at least a contour angle, wherein a first interconnection segment is generated having an angle based on at least the contour angle.

* * * * *